US012787823B2

(12) United States Patent
Brazzle et al.

(10) Patent No.: US 12,787,823 B2
(45) Date of Patent: Nov. 3, 2026

(54) STACKED VERTICAL POWER MODULE

(71) Applicant: Analog Devices, Inc., Wilmington, MA (US)

(72) Inventors: John David Brazzle, Tracy, CA (US); Vikas Paduvalli, San Jose, CA (US)

(73) Assignee: Analog Devices, Inc., Wilmington, MA (US)

( * ) Notice: Subject to any disclaimer, the term of this patent is extended or adjusted under 35 U.S.C. 154(b) by 350 days.

(21) Appl. No.: 18/525,409

(22) Filed: Nov. 30, 2023

(65) Prior Publication Data

US 2025/0183144 A1 Jun. 5, 2025

(51) Int. Cl.

*H01L 23/00* (2006.01)
*H10W 70/65* (2026.01)
*H10W 90/00* (2026.01)
*H10W 74/00* (2026.01)

(52) U.S. Cl.

CPC ........... *H10W 70/65* (2026.01); *H10W 90/00* (2026.01); *H10W 90/701* (2026.01); *H10W 74/00* (2026.01); *H10W 90/732* (2026.01); *H10W 90/734* (2026.01); *H10W 90/792* (2026.01); *H10W 90/794* (2026.01)

(58) Field of Classification Search

CPC .............................. H10W 70/65; H10W 90/00
See application file for complete search history.

(56) References Cited

U.S. PATENT DOCUMENTS

| | | | |
|---|---|---|---|
| 4,089,041 | A | 5/1978 | Lockard |
| 4,739,125 | A | 4/1988 | Watanabe et al. |
| 4,801,912 | A | 1/1989 | McElheny et al. |
| 4,862,246 | A | 8/1989 | Masuda et al. |

(Continued)

FOREIGN PATENT DOCUMENTS

| | | |
|---|---|---|
| CN | 101495014 | 7/2009 |
| CN | 102088241 | 6/2011 |

(Continued)

OTHER PUBLICATIONS

US 10,643,959 B2, 05/2020, Moussaouni et al. (withdrawn)

(Continued)

*Primary Examiner* — Thao P Le
(74) *Attorney, Agent, or Firm* — Knobbe, Martens, Olson & Bear, LLP

(57) ABSTRACT

An electronic assembly is disclosed. The electronic assembly can include a first integrated device package having a first substrate, a plurality of electronic components mounted to the first substrate, a first plurality of vertical interconnects connected to first substrate and extending outwardly, a first molding compound over at least portions of the plurality of electronic components, and an electromagnet connected to the first substrate. The electromagnet can be connected to the plurality of electronic components via one or more electrical connections. The electronic assembly can also include a second integrated device package having a second substrate, a second plurality of vertical interconnects connected to the second substrate, a second molding compound, and electrical terminals formed on a second side of the second substrate. The first and second vertical interconnects can be disposed between the first and second substrates.

16 Claims, 14 Drawing Sheets

(56) References Cited

U.S. PATENT DOCUMENTS

| | | | |
|---|---|---|---|
| 4,914,259 | A | 4/1990 | Kobayashi et al. |
| 5,038,197 | A | 8/1991 | Satriano |
| 5,343,075 | A | 8/1994 | Nishino |
| 5,485,037 | A | 1/1996 | Marrs |
| 5,514,907 | A | 5/1996 | Moshayedi |
| 5,535,101 | A | 7/1996 | Miles et al. |
| 5,647,124 | A | 7/1997 | Chan et al. |
| 5,706,172 | A | 1/1998 | Lee |
| 5,804,880 | A | 9/1998 | Mathew |
| 5,932,927 | A | 8/1999 | Koizumi et al. |
| 6,415,504 | B1 | 7/2002 | Matsuda |
| 6,529,109 | B1 | 3/2003 | Shikama et al. |
| 6,727,579 | B1 | 4/2004 | Eldridge et al. |
| 7,129,420 | B2 | 10/2006 | Hashimoto |
| 7,683,473 | B2 | 3/2010 | Kasai et al. |
| 7,838,334 | B2 | 11/2010 | Yu et al. |
| 7,939,934 | B2 | 5/2011 | Haba et al. |
| 7,977,773 | B1 | 7/2011 | Cusack |
| 7,982,139 | B2 | 7/2011 | Kariya et al. |
| 8,156,634 | B2 | 4/2012 | Gallup et al. |
| 8,193,034 | B2 | 6/2012 | Pagaila et al. |
| 8,203,164 | B2 | 6/2012 | Min et al. |
| 8,241,956 | B2 | 8/2012 | Camacho et al. |
| 8,258,010 | B2 | 9/2012 | Pagaila et al. |
| 8,283,750 | B2 | 10/2012 | Guiraud et al. |
| 8,349,657 | B2 | 1/2013 | Do et al. |
| 8,349,721 | B2 | 1/2013 | Shim et al. |
| 8,383,457 | B2 | 2/2013 | Pagaila et al. |
| 8,409,922 | B2 | 4/2013 | Camacho et al. |
| 8,445,990 | B2 | 5/2013 | Lin et al. |
| 8,502,387 | B2 | 8/2013 | Choi et al. |
| 8,513,812 | B2 | 8/2013 | Lin |
| 8,525,340 | B2 | 9/2013 | Eckhardt et al. |
| 8,525,344 | B2 | 9/2013 | Pagaila et al. |
| 8,530,274 | B2 | 9/2013 | Pagaila |
| 8,563,418 | B2 | 10/2013 | Pagaila et al. |
| 8,569,882 | B2 | 10/2013 | Ko et al. |
| 8,581,381 | B2 | 11/2013 | Zhao et al. |
| 8,623,702 | B2 | 1/2014 | Pagaila |
| 8,624,374 | B2 | 1/2014 | Ding et al. |
| 8,674,516 | B2 | 3/2014 | Han et al. |
| 8,790,962 | B2 | 7/2014 | Pagaila et al. |
| 8,847,369 | B2 | 9/2014 | Yew et al. |
| 8,853,819 | B2 | 10/2014 | Chen et al. |
| 8,877,567 | B2 | 11/2014 | Lee et al. |
| 8,932,908 | B2 | 1/2015 | Lee et al. |
| 8,941,222 | B2 | 1/2015 | Hunt |
| 8,987,734 | B2 | 3/2015 | Wang |
| 9,006,099 | B2 | 4/2015 | Anderson et al. |
| 9,029,193 | B2 | 5/2015 | Marimuthu et al. |
| 9,054,083 | B2 | 6/2015 | Suthiwongsunthorn et al. |
| 9,059,186 | B2 | 6/2015 | Shim et al. |
| 9,082,780 | B2 | 7/2015 | Lin et al. |
| 9,105,532 | B2 | 8/2015 | Choi et al. |
| 9,117,812 | B2 | 8/2015 | Lee et al. |
| 9,129,980 | B2 | 9/2015 | Khan et al. |
| 9,142,515 | B2 | 9/2015 | Pagaila et al. |
| 9,171,792 | B2 | 10/2015 | Sun et al. |
| 9,177,832 | B2 | 11/2015 | Camacho |
| 9,236,332 | B2 | 1/2016 | Pagaila et al. |
| 9,236,352 | B2 | 1/2016 | Pagaila et al. |
| 9,240,331 | B2 | 1/2016 | Kim et al. |
| 9,245,834 | B2 | 1/2016 | Hsieh |
| 9,257,356 | B2 | 2/2016 | Huang et al. |
| 9,257,411 | B2 | 2/2016 | Pagaila et al. |
| 9,269,595 | B2 | 2/2016 | Chi et al. |
| 9,275,877 | B2 | 3/2016 | Lin et al. |
| 9,281,228 | B2 | 3/2016 | Choi et al. |
| 9,299,650 | B1 | 3/2016 | Chi et al. |
| 9,324,659 | B2 | 4/2016 | Cho et al. |
| 9,331,002 | B2 | 5/2016 | Pagaila et al. |
| 9,337,116 | B2 | 5/2016 | Pagaila et al. |
| 9,343,387 | B2 | 5/2016 | Hsu et al. |
| 9,373,578 | B2 | 6/2016 | Choi et al. |
| 9,378,983 | B2 | 6/2016 | Choi et al. |
| 9,379,064 | B2 | 6/2016 | Oh et al. |
| 9,390,945 | B2 | 7/2016 | Lee et al. |
| 9,391,046 | B2 | 7/2016 | Park et al. |
| 9,397,074 | B1 | 7/2016 | Lee et al. |
| 9,401,347 | B2 | 7/2016 | Lee et al. |
| 9,406,552 | B2 | 8/2016 | Chen et al. |
| 9,406,579 | B2 | 8/2016 | Choi et al. |
| 9,406,636 | B2 | 8/2016 | Zhao et al. |
| 9,406,658 | B2 | 8/2016 | Lee et al. |
| 9,478,486 | B2 | 10/2016 | Kim et al. |
| 9,484,259 | B2 | 11/2016 | Lin et al. |
| 9,502,335 | B2 | 11/2016 | Lai et al. |
| 9,508,626 | B2 | 11/2016 | Pagaila et al. |
| 9,515,009 | B2 | 12/2016 | Fen et al. |
| 9,559,043 | B2 | 1/2017 | Ye |
| 9,570,381 | B2 | 2/2017 | Lu et al. |
| 9,589,910 | B2 | 3/2017 | Pagaila et al. |
| 9,601,369 | B2 | 3/2017 | Do et al. |
| 9,613,912 | B2 | 4/2017 | Scanlan |
| 9,653,407 | B2 | 5/2017 | Chen et al. |
| 9,679,881 | B2 | 6/2017 | Pagaila et al. |
| 9,729,059 | B1 | 8/2017 | Parto |
| 9,754,868 | B2 | 9/2017 | Chiang et al. |
| 9,768,144 | B2 | 9/2017 | Wu et al. |
| 9,799,621 | B2 | 10/2017 | Lee et al. |
| 9,824,923 | B2 | 11/2017 | Shariff et al. |
| 9,824,976 | B1 | 11/2017 | Cho |
| 9,842,808 | B2 | 12/2017 | Shin et al. |
| 9,847,324 | B2 | 12/2017 | Lin et al. |
| 9,899,921 | B1 | 2/2018 | Paduvalli |
| 9,922,917 | B2 | 3/2018 | Yu et al. |
| 9,922,955 | B2 | 3/2018 | Camacho et al. |
| 9,966,335 | B2 | 5/2018 | Cho et al. |
| 9,984,993 | B2 | 5/2018 | Shu et al. |
| 9,991,193 | B2 | 6/2018 | Essig et al. |
| 9,997,447 | B1 | 6/2018 | Chen et al. |
| 10,032,652 | B2 | 7/2018 | Hsu et al. |
| 10,096,578 | B1 | 10/2018 | Yeh et al. |
| 10,111,333 | B2 | 10/2018 | Yin et al. |
| 10,115,661 | B2 | 10/2018 | Doyle et al. |
| 10,115,701 | B2 | 10/2018 | Zhao et al. |
| 10,157,821 | B1 | 12/2018 | Liu |
| 10,157,887 | B2 | 12/2018 | Chen et al. |
| 10,157,890 | B2 | 12/2018 | Yu et al. |
| 10,163,867 | B2 | 12/2018 | Kim et al. |
| 10,163,876 | B2 | 12/2018 | Jeng et al. |
| 10,175,278 | B1 | 1/2019 | Paduvalli |
| 10,177,099 | B2 | 1/2019 | Gerber et al. |
| 10,186,467 | B2 | 1/2019 | Appelt et al. |
| 10,193,442 | B2 | 1/2019 | Parto |
| 10,199,320 | B2 | 2/2019 | Chiang et al. |
| 10,211,182 | B2 | 2/2019 | Meyer et al. |
| 10,224,301 | B2 | 3/2019 | Fang et al. |
| 10,229,859 | B2 | 3/2019 | Wang |
| 10,229,892 | B2 | 3/2019 | Appelt |
| 10,256,173 | B2 | 4/2019 | Wu et al. |
| 10,269,771 | B2 | 4/2019 | Lyu et al. |
| 10,276,382 | B2 | 4/2019 | Hunt et al. |
| 10,297,518 | B2 | 5/2019 | Lin et al. |
| 10,297,519 | B2 | 5/2019 | Lin |
| 10,319,507 | B2 | 6/2019 | Klesyk et al. |
| 10,325,868 | B2 | 6/2019 | Tsai |
| 10,332,862 | B2 | 6/2019 | Chen et al. |
| 10,361,150 | B2 | 7/2019 | Chung et al. |
| 10,381,300 | B2 | 8/2019 | Kao et al. |
| 10,388,598 | B2 | 8/2019 | Lu et al. |
| 10,403,609 | B2 | 9/2019 | Geissler et al. |
| 10,410,970 | B1 | 9/2019 | Chiu et al. |
| 10,418,314 | B2 | 9/2019 | Lu |
| 10,446,411 | B2 | 10/2019 | Chen et al. |
| 10,453,785 | B2 | 10/2019 | Shim et al. |
| 10,453,802 | B2 | 10/2019 | Hu |
| 10,497,635 | B2 | 12/2019 | Brazzle et al. |
| 10,510,703 | B2 | 12/2019 | Chi et al. |
| 10,510,720 | B2 | 12/2019 | Lin et al. |
| 10,515,806 | B2 | 12/2019 | Hunt et al. |
| 10,515,889 | B2 | 12/2019 | Lu |
| 10,522,476 | B2 | 12/2019 | Cheng et al. |
| 10,535,521 | B2 | 1/2020 | Hunt et al. |

(56) References Cited

U.S. PATENT DOCUMENTS 10,535,597 B2 1/2020 Chen et al.
10,548,249 B2 1/2020 Mokler et al.
10,553,487 B2 2/2020 Zhao et al.
10,573,624 B2 2/2020 Chen et al.
10,586,751 B2 3/2020 Huang
10,602,612 B1 3/2020 Hoang et al.
10,607,955 B2 3/2020 Chiu et al.
10,629,454 B2 4/2020 Yeh
10,629,531 B2 4/2020 Lin
10,636,756 B2 4/2020 Yang et al.
11,134,570 B2 9/2021 Lu et al.
11,272,618 B2 3/2022 Brazzle et al.
11,410,977 B2 8/2022 Brazzle et al.
11,749,576 B2 9/2023 Brazzle et al.
11,844,178 B2 12/2023 Brazzle et al.
2002/0089069 A1 7/2002 Lamson et al.
2003/0053286 A1 3/2003 Masuda et al.
2004/0124505 A1 7/2004 Mahle et al.
2004/0201081 A1 10/2004 Joshi et al.
2004/0222514 A1 11/2004 Crane, Jr. et al.
2004/0262774 A1 12/2004 Kang et al.
2005/0095835 A1 5/2005 Humpston et al.
2007/0114352 A1 5/2007 Victor R. Cruz et al.
2007/0222044 A1 9/2007 Otremba
2007/0246806 A1 10/2007 Ong et al.
2007/0262346 A1 11/2007 Otremba et al.
2007/0273049 A1 11/2007 Khan et al.
2008/0122049 A1 5/2008 Zhao et al.
2008/0128890 A1 6/2008 Choi et al.
2010/0013064 A1 1/2010 Hsu
2010/0133674 A1 6/2010 Hebert et al.
2011/0013349 A1 1/2011 Morikita et al.
2011/0115060 A1 5/2011 Chiu et al.
2011/0177654 A1 7/2011 Lee et al.
2011/0228507 A1 9/2011 Yin et al.
2011/0241194 A1 10/2011 Chen et al.
2011/0266699 A1 11/2011 Hilt et al.
2011/0292632 A1 12/2011 Wen et al.
2012/0025227 A1 2/2012 Chan et al.
2012/0074532 A1 3/2012 Shih et al.
2012/0139122 A1 6/2012 Honjo
2012/0181689 A1 7/2012 Do et al.
2012/0223428 A1 9/2012 Pendse
2012/0273960 A1 11/2012 Park et al.
2013/0015569 A1 1/2013 Anderson et al.
2013/0107469 A1 5/2013 Wei et al.
2013/0127029 A1 5/2013 Lee et al.
2013/0200527 A1 8/2013 Yang et al.
2013/0214399 A1 8/2013 Joshi et al.
2013/0234324 A1 9/2013 Cho et al.
2013/0249051 A1 9/2013 Saye
2013/0299971 A1 11/2013 Do et al.
2013/0341786 A1 12/2013 Hsu et al.
2014/0110860 A1 4/2014 Choi et al.
2014/0124919 A1 5/2014 Huang et al.
2014/0138807 A1 5/2014 Gowda et al.
2014/0145319 A1 5/2014 Meinhold et al.
2014/0151880 A1 6/2014 Kao et al.
2014/0154843 A1 6/2014 Liu et al.
2014/0159251 A1 6/2014 Marimuthu et al.
2014/0251670 A1 9/2014 Sakai et al.
2014/0264914 A1 9/2014 Meyer et al.
2014/0312503 A1 10/2014 Seo
2014/0361423 A1 12/2014 Chi et al.
2015/0061095 A1 3/2015 Choi et al.
2015/0084206 A1 3/2015 Lin
2015/0179570 A1 6/2015 Marimuthu et al.
2015/0179626 A1 6/2015 Zhang et al.
2015/0187710 A1 7/2015 Scanlan et al.
2015/0255360 A1 9/2015 Hsu et al.
2015/0279778 A1 10/2015 Camacho et al.
2015/0279815 A1 10/2015 Do et al.
2015/0325509 A1 11/2015 We et al.
2015/0325516 A1 11/2015 Lin et al.
2016/0035656 A1 2/2016 Haba et al.
2016/0066406 A1 3/2016 Chen et al.
2016/0071831 A1 3/2016 Lee et al.
2016/0088754 A1 3/2016 Francis
2016/0126176 A1 5/2016 Chang et al.
2016/0150632 A1 5/2016 Viswanathan et al.
2016/0276256 A1 9/2016 Chiang et al.
2016/0284642 A1 9/2016 Ganesan et al.
2016/0307799 A1 10/2016 Ho et al.
2016/0322343 A1 11/2016 Scanlan
2016/0329272 A1 11/2016 Geissler et al.
2016/0343651 A1 11/2016 Rae et al.
2017/0011936 A1 1/2017 Lin et al.
2017/0062120 A1 3/2017 Yun et al.
2017/0077039 A1 3/2017 Liao et al.
2017/0077364 A1 3/2017 Renn et al.
2017/0098610 A1 4/2017 Shim et al.
2017/0110392 A1 4/2017 Lin et al.
2017/0125389 A1 5/2017 Kulick et al.
2017/0148746 A1 5/2017 Chiu et al.
2017/0162476 A1 6/2017 Meyer et al.
2017/0179041 A1 6/2017 Dias et al.
2017/0179048 A1 6/2017 Moussaoui et al.
2017/0186702 A1 6/2017 Liang et al.
2017/0221858 A1 8/2017 Yu et al.
2017/0250172 A1 8/2017 Huang et al.
2017/0256481 A1 9/2017 Chen et al.
2017/0278807 A1 9/2017 Chiu et al.
2017/0311447 A1 10/2017 Brazzle et al.
2018/0052281 A1 2/2018 Kuo et al.
2018/0061815 A1 3/2018 Fang et al.
2018/0068970 A1 3/2018 Tanida et al.
2018/0068983 A1 3/2018 Chang et al.
2018/0076165 A1 3/2018 Aoki et al.
2018/0090466 A1 3/2018 Hung
2018/0102325 A1 4/2018 Yu et al.
2018/0130774 A1 5/2018 Lin et al.
2018/0138113 A1 5/2018 Chen et al.
2018/0138131 A1 5/2018 Kawabata
2018/0151485 A1 5/2018 Kao et al.
2018/0158779 A1 6/2018 Yang et al.
2018/0182704 A1 6/2018 Yeh
2018/0261551 A1 9/2018 Lee et al.
2018/0269708 A1 9/2018 Yeh
2018/0297834 A1 10/2018 Renaud-Bezot et al.
2018/0301269 A1 10/2018 Sundaram
2018/0331018 A1 11/2018 Shim et al.
2018/0331050 A1 11/2018 Chung et al.
2018/0337130 A1 11/2018 Chang Chien et al.
2018/0342447 A1 11/2018 Ahlers et al.
2018/0342484 A1 11/2018 Chiu et al.
2018/0350766 A1 12/2018 Sato et al.
2018/0374798 A1 12/2018 Lee et al.
2018/0374833 A1 12/2018 Wong et al.
2019/0013301 A1 1/2019 Cheah et al.
2019/0019763 A1 1/2019 Chang et al.
2019/0043819 A1 2/2019 Ho et al.
2019/0051590 A1 2/2019 Fang et al.
2019/0057940 A1 2/2019 Cheah et al.
2019/0115319 A1 4/2019 Hiner et al.
2019/0132983 A1 5/2019 Weis et al.
2019/0139846 A1 5/2019 Lu
2019/0139946 A1 5/2019 Kim et al.
2019/0148304 A1 5/2019 Gavagnin et al.
2019/0206799 A1 7/2019 Keser et al.
2019/0237374 A1 8/2019 Huang et al.
2019/0252305 A1 8/2019 Peng et al.
2019/0273044 A1 9/2019 Fu et al.
2019/0304807 A1 10/2019 Baloglu et al.
2019/0304865 A1 10/2019 Brazzle et al.
2019/0304936 A1 10/2019 Shaul et al.
2019/0319337 A1 10/2019 Yen
2019/0355654 A1 11/2019 Xu et al.
2019/0363423 A1 11/2019 Lu et al.
2019/0371621 A1 12/2019 Darmawikarta et al.
2019/0393140 A1 12/2019 Yeh et al.
2020/0006089 A1 1/2020 Yu et al.
2020/0006253 A1 1/2020 Cheah et al.
2020/0006295 A1 1/2020 Yang et al.
2020/0051927 A1 2/2020 Lin et al.

(56) References Cited

U.S. PATENT DOCUMENTS

| | | | |
|---|---|---|---|
| 2020/0075490 A1 | 3/2020 | Sung et al. | |
| 2020/0075562 A1 | 3/2020 | Yu et al. | |
| 2020/0083591 A1 | 3/2020 | Hsieh et al. | |
| 2020/0091059 A1 | 3/2020 | Lin et al. | |
| 2020/0105653 A1 | 4/2020 | Elsherbini et al. | |
| 2020/0111717 A1 | 4/2020 | Gmunder et al. | |
| 2020/0111748 A1 | 4/2020 | Leitgeb | |
| 2020/0120794 A1 | 4/2020 | Somada et al. | |
| 2020/0126921 A1 | 4/2020 | Nair et al. | |
| 2020/0144198 A1 | 5/2020 | Lee et al. | |
| 2020/0152372 A1 | 5/2020 | Wei et al. | |
| 2020/0185293 A1 | 6/2020 | Schmalzl et al. | |
| 2020/0185330 A1 | 6/2020 | Yu et al. | |
| 2020/0205279 A1 | 6/2020 | Ecton et al. | |
| 2020/0211927 A1 | 7/2020 | Wan et al. | |
| 2021/0082790 A1 | 3/2021 | Zhang et al. | |
| 2021/0143786 A1 | 5/2021 | Aizawa et al. | |
| 2021/0378098 A1 | 12/2021 | Brazzle et al. | |
| 2022/0238450 A1 | 7/2022 | Wei et al. | |
| 2022/0255249 A1 | 8/2022 | Kikuta | |
| 2023/0317575 A1 | 10/2023 | Pham | |
| 2024/0047335 A1* | 2/2024 | We | H10W 70/093 |
| 2024/0249986 A1* | 7/2024 | Bark | H10P 72/74 |
| 2024/0321752 A1* | 9/2024 | We | H01G 4/40 |
| 2025/0168966 A1 | 5/2025 | Paduvalli et al. | |
| 2025/0266207 A1 | 8/2025 | Paduvalli et al. | |
| 2025/0370196 A1* | 12/2025 | Lan | G02B 6/4238 |
| 2025/0385186 A1* | 12/2025 | Bishop | H10W 70/611 |
| 2026/0026400 A1 | 1/2026 | Paduvalli | |
| 2026/0032933 A1 | 1/2026 | Paduvalli | |
| 2026/0033352 A1* | 1/2026 | Patil | H10W 70/611 |
| 2026/0076272 A1* | 3/2026 | Lee | H10W 40/258 |

FOREIGN PATENT DOCUMENTS

| | | |
|---|---|---|
| CN | 201893335 U | 7/2011 |
| CN | 203839367 U | 9/2014 |
| CN | 104221145 | 12/2014 |
| CN | 104934391 | 9/2015 |
| CN | 107170718 | 9/2017 |
| CN | 109075151 | 12/2018 |
| CN | 110299329 | 10/2019 |
| CN | 110364491 | 10/2019 |
| CN | 111108598 | 5/2020 |
| CN | 111149201 | 5/2020 |
| EP | 0384927 | 9/1990 |
| EP | 1475177 | 11/2004 |
| EP | 2381472 | 10/2011 |
| EP | 3217774 | 9/2017 |
| EP | 3582598 | 12/2019 |
| JP | S59-155154 | 9/1984 |
| JP | H03-233995 | 10/1991 |
| JP | 5-21660 | 1/1993 |
| JP | H05-243327 | 9/1993 |
| JP | 2012-151019 | 8/2012 |
| KR | 10-0652518 | 12/2006 |
| KR | 10-2010-0124407 | 11/2010 |
| KR | 2020-0010521 | 1/2020 |
| WO | WO 2010/067508 | 6/2010 |
| WO | WO 2017/189224 | 11/2017 |
| WO | WO 2019/066986 | 4/2019 |
| WO | WO 2019/066987 | 4/2019 |
| WO | WO 2019/132963 | 7/2019 |
| WO | WO 2019/132965 | 7/2019 |
| WO | WO 2021/124691 | 6/2021 |
| WO | WO 2023/192767 | 10/2023 |

OTHER PUBLICATIONS

Notice of Allowance with English translation in Korean application No. 10-2020-7026175, dated Jun. 10, 2024, in 9 pages.
International Preliminary Report on Patentability and Written Opinion for application No. PCT/US2023/064298, dated Sep. 24, 2024, in 9 pages.
International Search Report and Written Opinion in application no. PCT/US2024/050687, mailed on Dec. 17, 2024, in 26 pages.
"DW3316 Coupled Inductors for xDSL", Document 232, revised Nov. 9, 2020, www.coilcraft.com, 1 page.
International Search Report and Written Opinion for International Application No. PCT/US2019/021908, mailed on Aug. 27, 2019, in 16 pages.
International Search Report and Written Opinion for application No. PCT/US2017/027047, mailed on Jun. 29, 2017, in 10 pages.
International Preliminary Report on Patentability for application No. PCT/US2017/027047, dated Oct. 30, 2018, in 7 pages.
International Preliminary Report on Patentability for application No. PCT/US2019/021908, dated Sep. 29, 2020, in 9 pages.
Final Office Action in U.S. Appl. No. 15/495,405, dated Oct. 18, 2018, in 17 pages.
Non-Final Office Action in U.S. Appl. No. 15/495,405, dated Apr. 5, 2018, in 12 pages.
Response in U.S. Appl. No. 15/495,405, filed Jun. 12, 2018, in 8 pages.
Office Action in Taiwan Application No. 106113400, dated Jul. 4, 2018, with concise statement of relevance, in 5 pages.
Response in Taiwan Application No. 106113400, filed Jan. 9, 2019, with English claims, in 4 pages.
Office Action in Taiwan Application No. 106113400, dated Jan. 16, 2019, in 10 pages.
Response in Taiwan Application No. 106113400, filed Apr. 3, 2019, with English claims, in 16 pages.
Office Action in Taiwan Application No. 106113400, dated Apr. 29, 2019, with English translation, in 4 pages.
Response to Communication Pursuant to Rules 161(1) and 162 EPC, with English Claims, in European Application No. 17719130.1, filed Jun. 3, 2019, in 24 pages.
Partial Search Report in European Application No. 21175552.5, dated Oct. 29, 2021, in 11 pages.
Office Action in Chinese Application No. 201780025431.5, dated Nov. 30, 2021.
Office Action with English translation in Chinese Application No. 201780025431.5, dated Jul. 18, 2022.
Office Action in Chinese Application No. 201980000486.X, dated Sep. 20, 2022.
Office Action in Chinese Application No. 201980000486.X, dated Jun. 29, 2023.
International Search Report and Written Opinion in application No. PCT/US2023/064298, mailed on Jun. 30, 2023, in 12 pages.
Office Action in Korean Application No. 10-2020-7026175, dated Sep. 18, 2023.
Office Action in Chinese application No. 202110612000.7, dated Jan. 12, 2024, in 9 pages.
Office Action in European application No. 21175552.5, dated Feb. 20, 2024, in 9 pages.

* cited by examiner

STACKED VERTICAL POWER MODULE

BACKGROUND

Field

The field relates to electronic modules for high power applications.

Description of the Related Art

Advancements have been made to improve the integration and performance of microelectronic devices. As microelectronic devices have become more complex, various packaging solutions have been developed to address the challenges posed by high power requirements and demands for compact and efficient designs.

SUMMARY

For purposes of summarizing the disclosure and the advantages achieved over the prior art, certain objects and advantages of the disclosure are described herein. Not all such objects or advantages may be achieved in any particular embodiment. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these implementations are intended to be within the scope of the invention herein disclosed. These and other implementations will become readily apparent to those skilled in the art from the following detailed description of the preferred implementations having reference to the attached figures, the invention not being limited to any particular preferred implementations disclosed.

In one implementation, an electronic assembly can include: a first integrated device package including: a first substrate; a plurality of electronic components mounted to a first side of the first substrate; a first plurality of vertical interconnects physically and electrically connected to a second side opposite the first side of the first substrate, the first plurality of vertical interconnects extending outwardly from the second side of the first substrate; a first molding compound over at least portions of the plurality of electronic components; and an electromagnet physically and electrically connected to the second side of the first substrate, the electromagnet electrically connected to the plurality of electronic components via one or more electrical connections through the first substrate; a second integrated device package including: a second substrate; a second plurality of vertical interconnects having a first end electrically connected to a first side of the second substrate, the second plurality of vertical interconnects having a second end electrically connected to the first plurality of vertical interconnects; a second molding compound in which the second plurality of vertical interconnects is at least partially embedded; and electrical terminals formed on a second side of the second substrate, wherein the first and second vertical interconnects are disposed between the first and second substrates.

In some implementations, the one or more electrical connections are exposed through the first molding compound and second molding compound to form a pad. In some implementations, the plurality of electronic components include field effect transistors. In some implementations, a top side of the field effect transistors are exposed through the first molding compound. In some implementations, the plurality of electronic components further include capacitors. In some implementations, the first plurality of vertical interconnects have a height in a range of 1.5 mm to 4 mm. In some implementations, the electrical terminals include a ball grid array. In some implementations, the first plurality of vertical interconnects is electrically connected to the second plurality of vertical interconnects by a conductive adhesive.

In some implementations, the electromagnet is soldered to the second side of the first substrate. In some implementations, the electronic assembly includes a third molding compound in which the first plurality of vertical interconnects and the electromagnet are at least partially embedded. In some implementations, at least one of the first substrate and the second substrate include a BT substrate. In some implementations, the first and second pluralities of vertical interconnects have an aspect ratio in a range of 1:1 to 10:1.

In some implementations, the first and second pluralities of vertical interconnects include copper. In some implementations, the electromagnet is physically attached to a top surface of the second integrated device package. In some implementations, the electromagnet is physically attached by an adhesive. In some implementations, the adhesive includes epoxy. In some implementations, the electronic assembly includes electrical components mounted to the second substrate. In some implementations, the plurality of electronic components cycle on and off to control an electrical current passing through the electromagnet.

In another implementation, a method of manufacturing an electronic assembly can include: forming a first integrated device package, wherein forming the first integrated device package includes: mounting a plurality of electronic components to a first substrate; mounting a first plurality of vertical interconnects to a second side of the first substrate, the first plurality of vertical interconnects extending outwardly from the first substrate, and the first plurality of vertical interconnects having a first end mounted to the first substrate by a conductive adhesive; mounting an electromagnet to the second side of the first substrate by an adhesive; providing a first molding compound in which the plurality of electronic components are at least partially embedded, forming a second integrated device package, wherein forming the first integrated device package includes: mounting a second plurality of vertical interconnects to a first side of a second substrate by a conductive adhesive, the second plurality of vertical interconnects extending outwardly from the second substrate, and the second plurality of vertical interconnects having a first end mounted to the second substrate by a conductive adhesive; mounting electrical terminals to a second side of the second substrate; providing a second molding compound in which the second plurality of vertical interconnects are at least partially embedded; and attaching the second integrated device package to the first integrated device package.

In some implementations, the method includes connecting the first plurality of vertical interconnects and the second plurality of vertical interconnects with a conductive adhesive. In some implementations, the method includes providing a third molding compound in which the first plurality of vertical interconnects and the electromagnet are at least partially embedded, and a second end of the first plurality of vertical interconnects and the electromagnet exposed through the third molding compound. In some implementations, the method includes attaching the electromagnet to the second molding compound by an adhesive.

In another implementation an electronic assembly can include: a first integrated device package including a first substrate, a plurality of electronic components mounted to a first side of the first substrate, a first plurality of vertical interconnects physically and electrically connected to a second side opposite the first side of the first substrate, and an electromagnet physically and electrically connected to the second side of the first substrate, wherein the electromagnet is electrically connected to the plurality of electronic components via one or more vias through the first substrate; and a second integrated device package including a second substrate, a second plurality of vertical interconnects including a first end electrically connected to a first side of the second substrate, and electrical terminals formed on a second side of the second substrate, wherein a second end of the second plurality of vertical interconnects is electrically connected to the first plurality of vertical interconnects.

In some implementations the second plurality of vertical interconnects have a second end electrically connected to the first plurality of vertical interconnects. In some implementations, the first and second vertical interconnects are disposed between the first and second substrates.

In another implementation, an electronic assembly can include: a first integrated device package including: a first substrate; a plurality of electronic components mounted to a first side of the first substrate, a first plurality of vertical interconnects physically and electrically connected to a second side opposite the first side of the first substrate, the first plurality of vertical interconnects extending outwardly from the first substrate; and an electromagnet physically and electrically connected to the second side of the first substrate, wherein the electromagnet is electrically connected to the plurality of electronic components by one or more conductors through the first substrate.

In some implementations, the electronic assembly includes a molding compound over at least a portion of the plurality of electronic components. In some implementations, the electronic assembly includes a second integrated device package mounted to the first integrated device package, the second integrated device package including a second substrate, a second plurality of vertical interconnects including a first end electrically connected to a first side of the second substrate, and electrical terminals formed on a second side of the second substrate, wherein a second end of the second plurality of vertical interconnects is electrically connected to the first plurality of vertical interconnects.

In another implementation, an electronic assembly can include: a first integrated device package including a first substrate, a plurality of electronic components mounted to a first side of the first substrate, a first plurality of vertical interconnects physically and electrically connected to a second side opposite the first side of the first substrate, a first molding compound over at least portions of the plurality of electronic components, and devices physically and electrically connected to the second side of the first substrate, wherein the devices are electrically connected to the plurality of electronic components via one or more vias through the first substrate; and a second integrated device package including a second substrate, a second plurality of vertical interconnects including a first end electrically connected to a first side of the second substrate, and electrical terminals formed on a second side of the second substrate, wherein a second end of the second plurality of vertical interconnects is electrically connected to the first plurality of vertical interconnects.

In some implementations, the second plurality of vertical interconnects have a second end electrically connected to the first plurality of vertical interconnects. In some implementations, the first and second vertical interconnects are disposed between the first and second substrates.

BRIEF DESCRIPTION OF THE DRAWINGS

Various implementations will be described hereinafter with reference to the accompanying drawings. These implementations are illustrated and described by example only and are not intended to limit the scope of the disclosure. In the drawings, similar elements have similar reference numerals.

DETAILED DESCRIPTION

The present disclosure may be understood by reference to the following detailed description. It is noted that, for purposes of illustrative clarity, certain elements in various drawings may not be drawn to scale, may be represented schematically or conceptually, or otherwise may not correspond exactly to certain physical configurations of embodiments.

This disclosure relates to high power density packages and package modules that utilize low impedance connections, packages that utilize electrical and/or magnetic isolation, and packages that operate at high thermal performance parameters. This disclosure is also directed to micro-electronic module packages with land-grid array (LGA) and/or ball-grid array (BGA) lead configurations that can use an alternative interconnection to a system board or motherboard. This disclosure is also related to three-dimensional (3D) assembled and/or stacked packages with high power and/or high current applications that also use large externally mounted components and incorporate improved heat dissipation.

Vertical power applications utilize ever-increasing power and current densities within the electronic package. However, current package technologies are unable to meet the expanding demand for power densities. For example, power densities used for the advancement of artificial intelligence (AI) computing, self-driving, and self-learning computing systems are increasing beyond conventional packaging capabilities. To facilitate such power and current densities, a package can implement a stackable micro-electronic module design that can incorporate vertical interconnections made from conductive materials (e.g., solid copper) and coupled magnetic devices. The vertical interconnects can provide input/output pad connectivity between stacked micro-electronic modules while the magnetic devices provide additional structural integrity. Such a stacked hybrid package can provide multiple advantages over existing technologies including: (1) a two-stage stacked design to allow for customizable configurations/combinations of stacked micro-electronic modules; (2) optimal thermal-to-case performance with overmolded topside and exposed Silicon Driven MOSFET (Si DrMOS); (3) improved current flow between stacked micro-electronic modules through the use of solid vertical interconnects; and (4) new construction can use several developed capabilities: internal/external vertical interconnects, exposed die, Component on Package (CoP), Package on Package (PoP).

Figure 1:
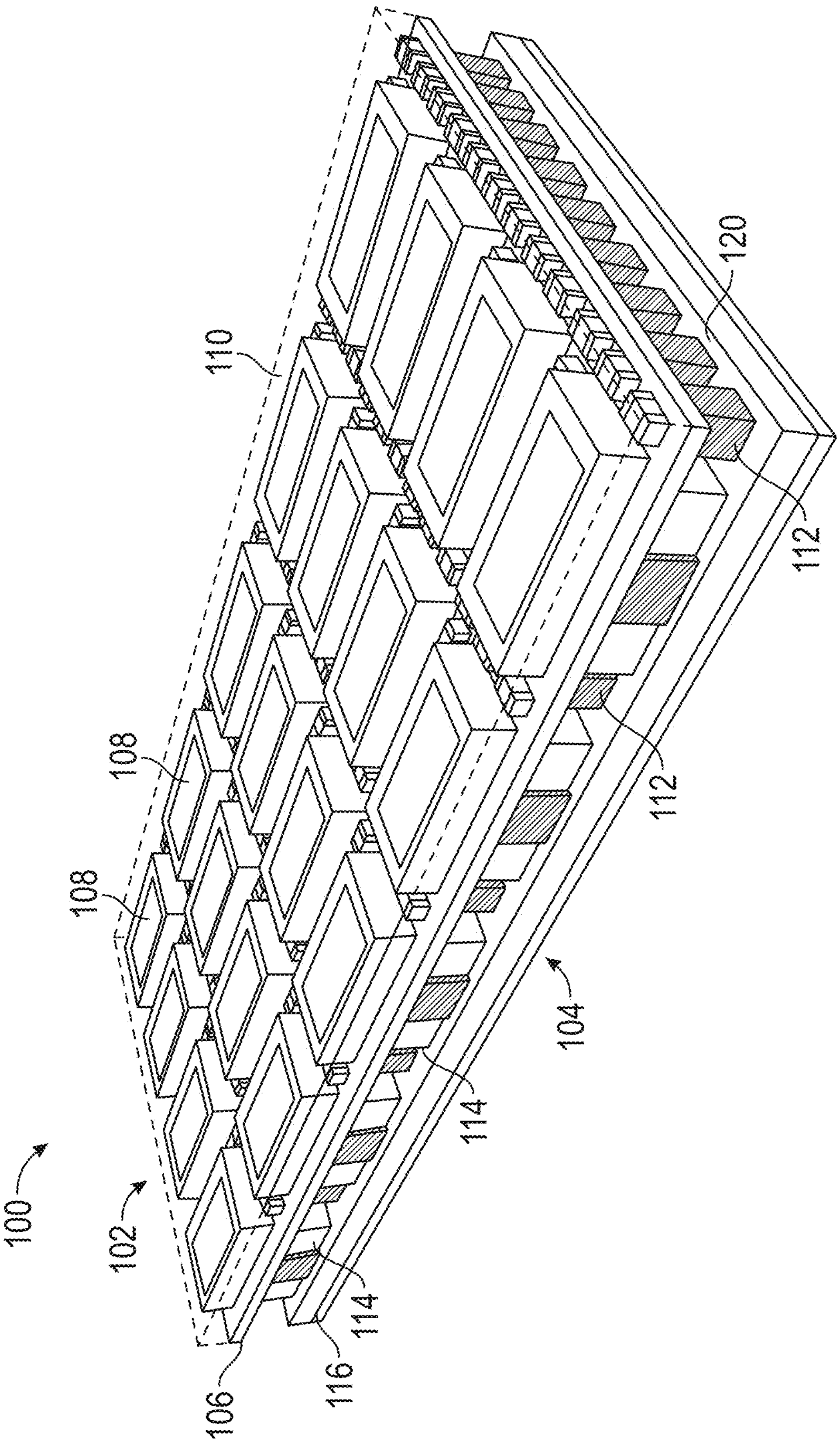
FIG. 1 is a schematic top perspective view of an electronic assembly, according to various implementations.
Figure 2:
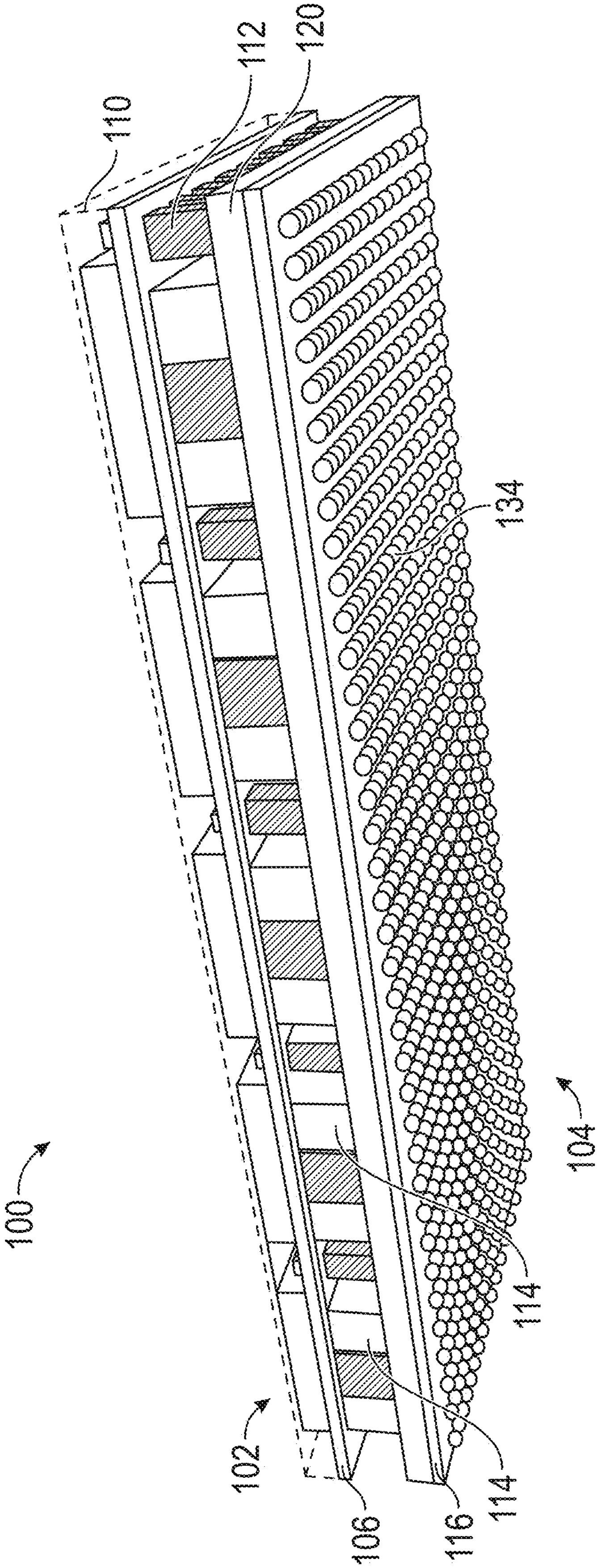
FIG. 2 is a schematic bottom perspective view of the electronic assembly of FIG. 1, according to various implementations.
Figure 3:
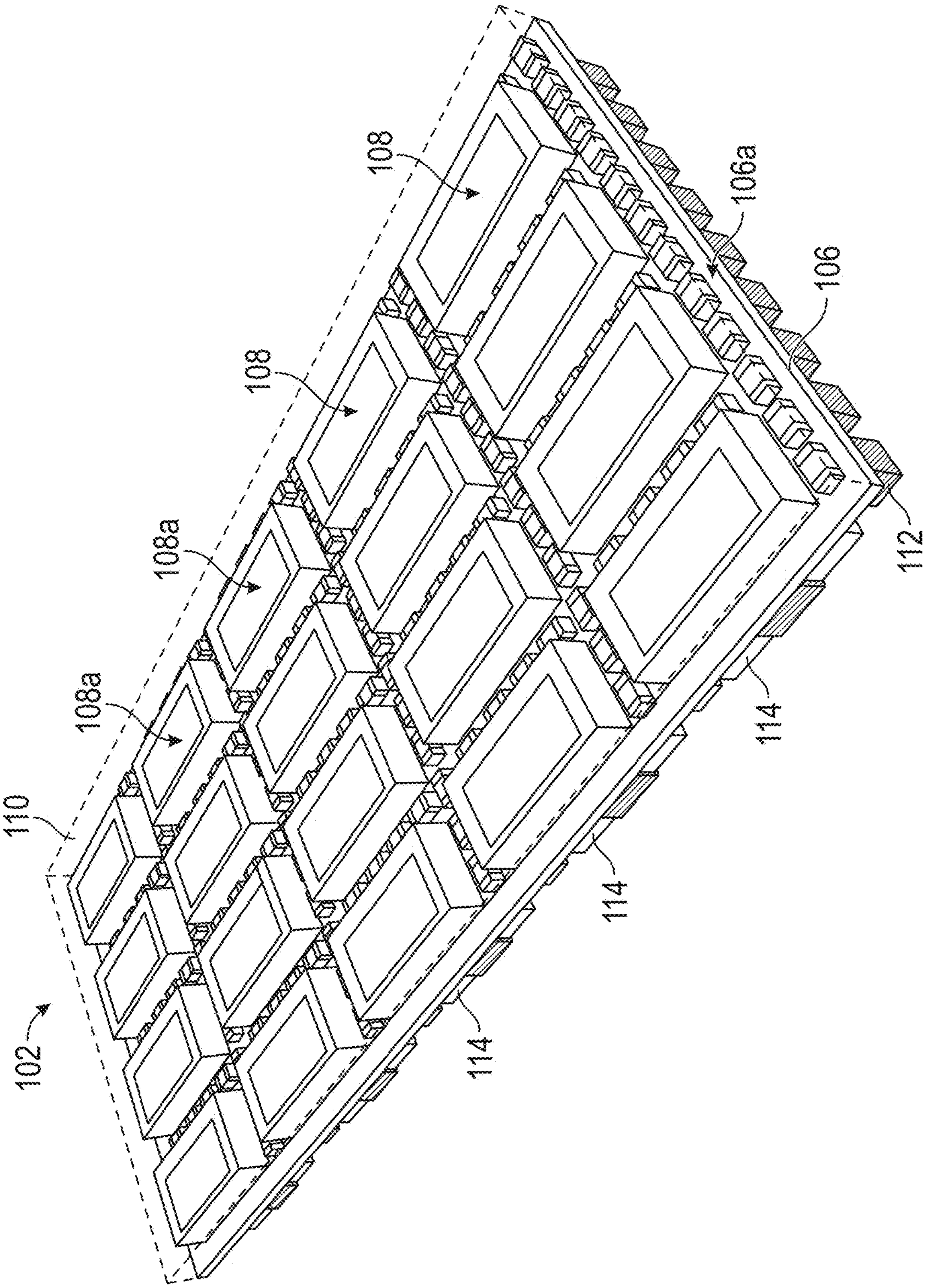
FIG. 3 is a schematic top perspective view of a first integrated device package of the electronic assembly of FIGS. 1 and 2, according to various implementations.
Figure 4:
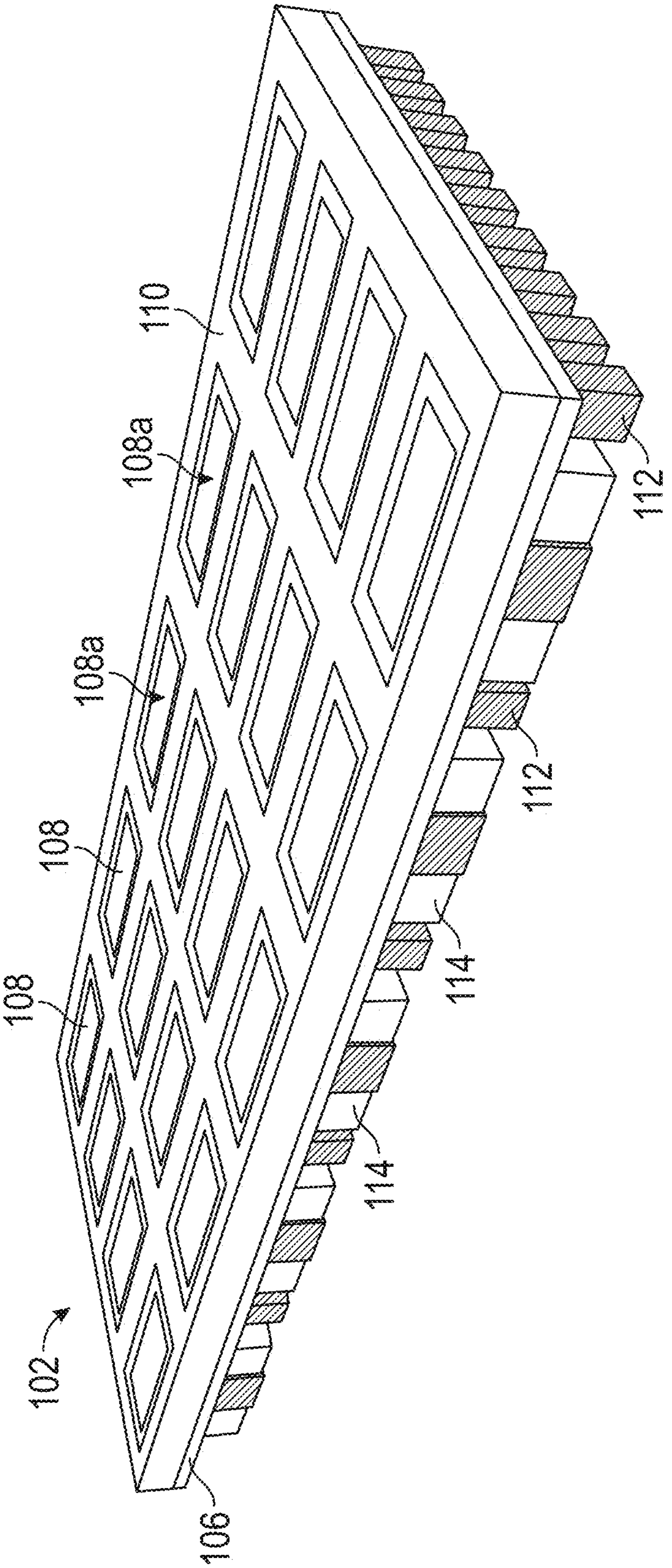
FIG. 4 is another schematic top perspective view of the first integrated device package of FIG. 3 that includes a molding compound, according to various implementations.
Figure 5:
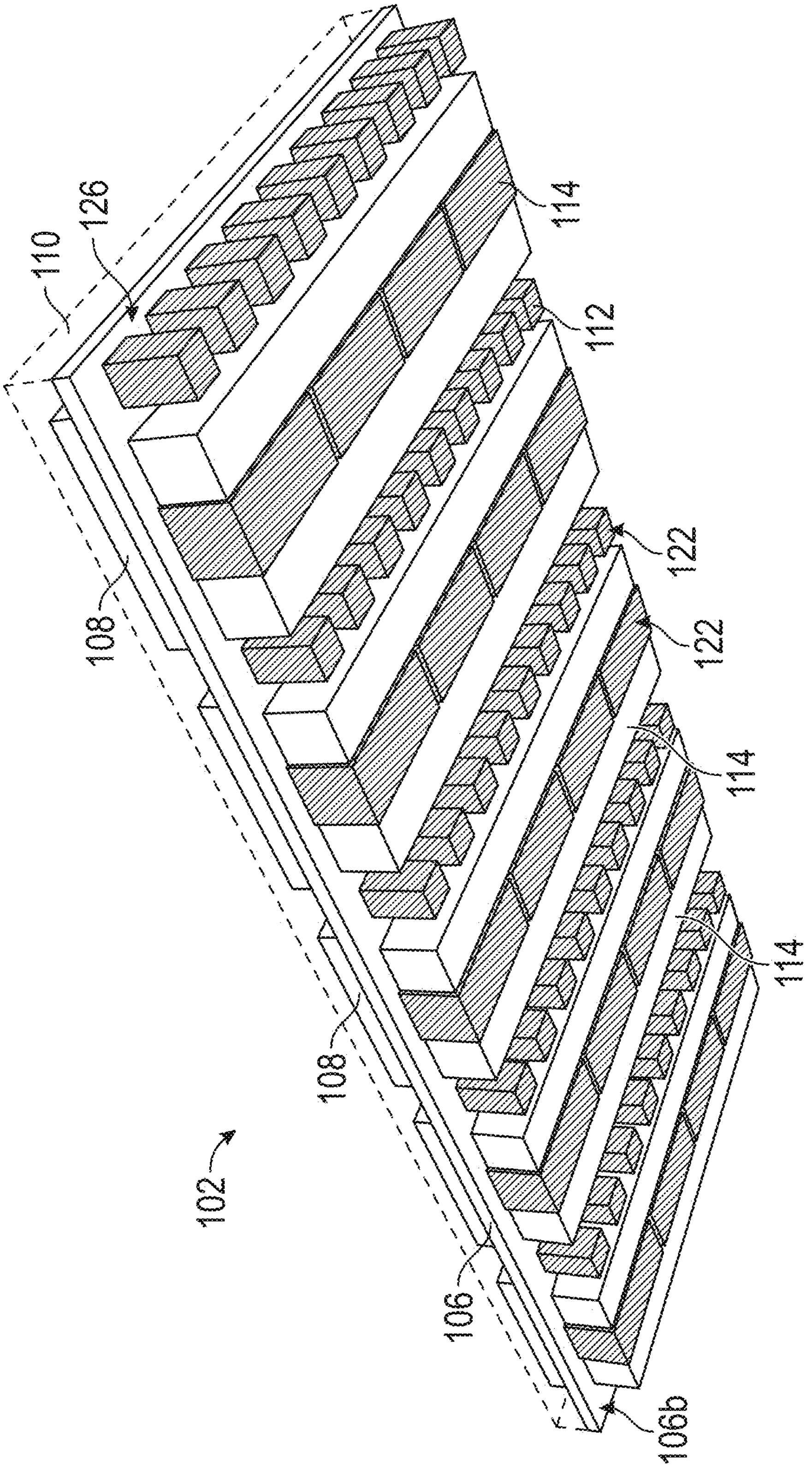
FIG. 5 is a schematic bottom perspective view of the first integrated device package shown in FIGS. 3 and 4.

FIGS. 1 and 2 illustrate an electronic assembly 100 that includes a first integrated device package 102 and a second integrated device package 104. FIGS. 3-5 illustrate perspective views of the first integrated device package 102 shown in FIGS. 1 and 2. FIG. 3 is a schematic top perspective view of the first integrated device package 102. FIG. 4 is another schematic top perspective view of the second integrated device package 104 that includes a molding compound. FIG. 5 is a schematic bottom perspective view of the first integrated device package 102. The disclosed implementation can allow for an increase in current and power density. The electronic assembly 100 can combine an overmolded structure with another overmolded structure and/or an open-frame package to form a single functional package (e.g., electronic assembly 100). The single functional package can include the thermal and performance benefits of the overmolded and open-frame structures combined into this highly dense structure. The first integrated device package 102 can include a first substrate 106 (such as a package substrate, e.g., a printed circuit board, or PCB substrate) with surface mount technology (SMT) attached electronic components 108 mounted to a first surface 106*a* of the first substrate 106. In some implementations, the PCB substrate can be a Bismaleimide Triazine (BT) substrate rather than a FR-4 substrate. BT substrates can be utilized in high power applications, such as military and aerospace electronics, high-speed data communication systems, and automotive electronics, for uses of high thermal stability, dimensional stability, and/or high dielectric strength. Although a PCB substrate can be used for the first substrate 106 in the example of FIGS. 1-3, in other implementations, different types of package substrates (such as lead frame substrates, ceramic substrates, etc.) may be used. For example, the electronic components 108 can be attached to pads or leads of the first substrate 106 using a conductive adhesive, such as solder, a conductive epoxy, etc. In various implementations, the electronic components 108 can be pick-and-placed onto the first substrate 106. The electronic components 108 can comprise any suitable type of electronic component, such as integrated device die(s), other types of active components, passive components (e.g., resistors, capacitors, inductors, field effect transistors (FETs), etc.), sensors, microelectromechanical systems (MEMs) components, or any other suitable type of component. For example, the electronic components 108 can include a combination of FETs and capacitors. In some implementations, a first molding and/or encapsulant compound 110 can be molded over at least portions of the electronic components 108 (e.g., molded over the first surface 106*a* of the first integrated device package 102 to protect the electronic components 108 mounted thereto). In some implementations, a top side 108*a* of the electronic components 108 can be exposed through the molding compound 110. For example, as shown in FIGS. 3 and 4, a laser deflashing technique or release mold can be used to expose the top side 108*a* of the electronic components 108. In some implementations, the molding compound or encapsulant 110 can have at least one layer removed (e.g., machined) to at least partially expose the electronic components 108 for heat dissipation into an ambient environment. In some implementations, the electronic components 108 can be completely embedded within the molding compounds 110.

As shown in FIG. 5, the first integrated device package 102 can further include vertical interconnects 112 that can be physically and/or electrically connected to the second surface 106*b* opposite the first surface 106*a* of the first substrate 106 with a conductive adhesive (e.g., solder, a conductive epoxy, etc.). The vertical interconnects 112 can extend outwardly from the second surface 106*b*. Additionally, electromagnets 114 can be physically and/or electrically connected to the second surface 106*b* of the first substrate 106. The electromagnets 114 can be attached to the first substrate 106 using a conductive adhesive, such as solder, a conductive epoxy, etc. In some implementations, the electromagnets 114 can be electrically connected to the electronic components 108 via one or more electrical connections (not shown) through the first substrate 106. The electronic components 108 can cycle on and off to control an electrical current passing through the electromagnets 114. The electromagnets 114 can act as a stiffener and provide additional rigidity to the electronic assembly 100. The electromagnets 114 can also contribute to the thermal mass of the package in that the electromagnets 114 can pull additional heat from the electronic components 108 and provide additional sinking and further conductive heat flow throughout and in-between the first integrated device package 102 and/or second integrated device package 104. The electromagnets 114 can influence the behavior of charged particles, such as electrons, to manipulate heat. Further, the electromagnets 114 can comprise materials having thermal conductive properties to transfer heat from and away the electronic components 108. By including the electromagnets 114 in the electronic assembly 100, the electronic assembly 100 can have improved heat dissipation, durability, and/or reduce degradation in performance. In some implementations, a molding compound 126 can be molded over at least a portion of the second surface 106*b* the vertical interconnects 112 and electromagnets 114 are at least partially embedded in the molding compound 126. In other implementations, the second surface 106*b* can include an open frame construction such that there is no molding or encapsulant compound.

In some implementations, the vertical interconnects 112 can be taller than the electromagnets 114. For example, the vertical interconnects 112 can extend from first substrate 106 and can extend beyond the electromagnets 114. The vertical interconnects 112 can be attached to the first substrate 106 using SMT techniques. For example, in various implementations, the vertical interconnects 112 can be picked and placed on the first substrate 106 and attached to the first substrate 106 using a conductive adhesive (e.g., solder, a conductive epoxy, etc.). In various implementations, the first substrate 106 can include embedded conductors to electrically connect the vertical interconnects 112 with the electronic components 108, and/or the electronic components 108 to one another. The vertical interconnects 112 can provide a conductive path and connection (e.g., a solder or other suitable connection) to the second integrated device package 104.

Figure 6:
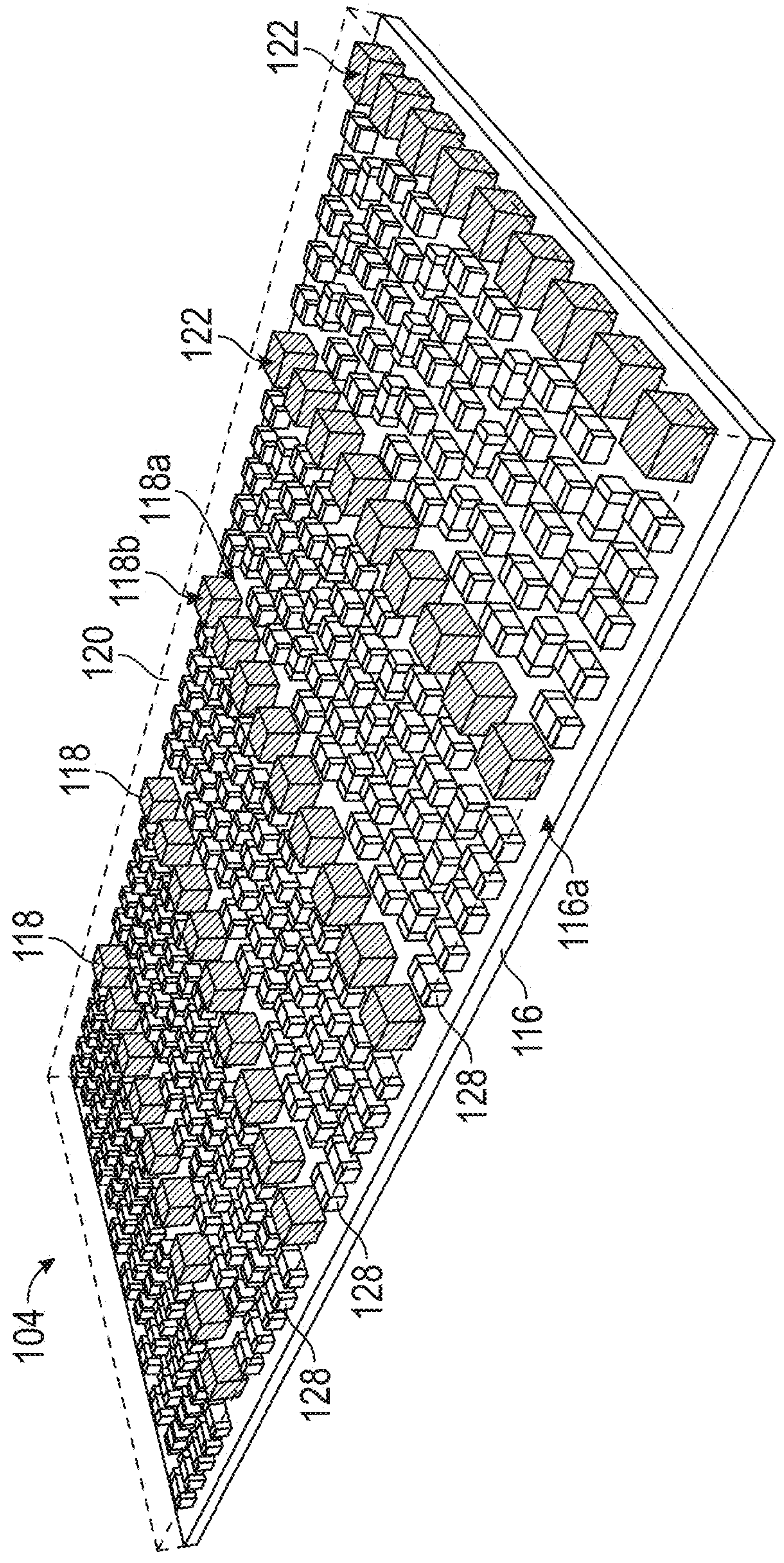
FIG. 6 is a schematic top perspective view of a second integrated device package, according to various implementations.
Figure 7:
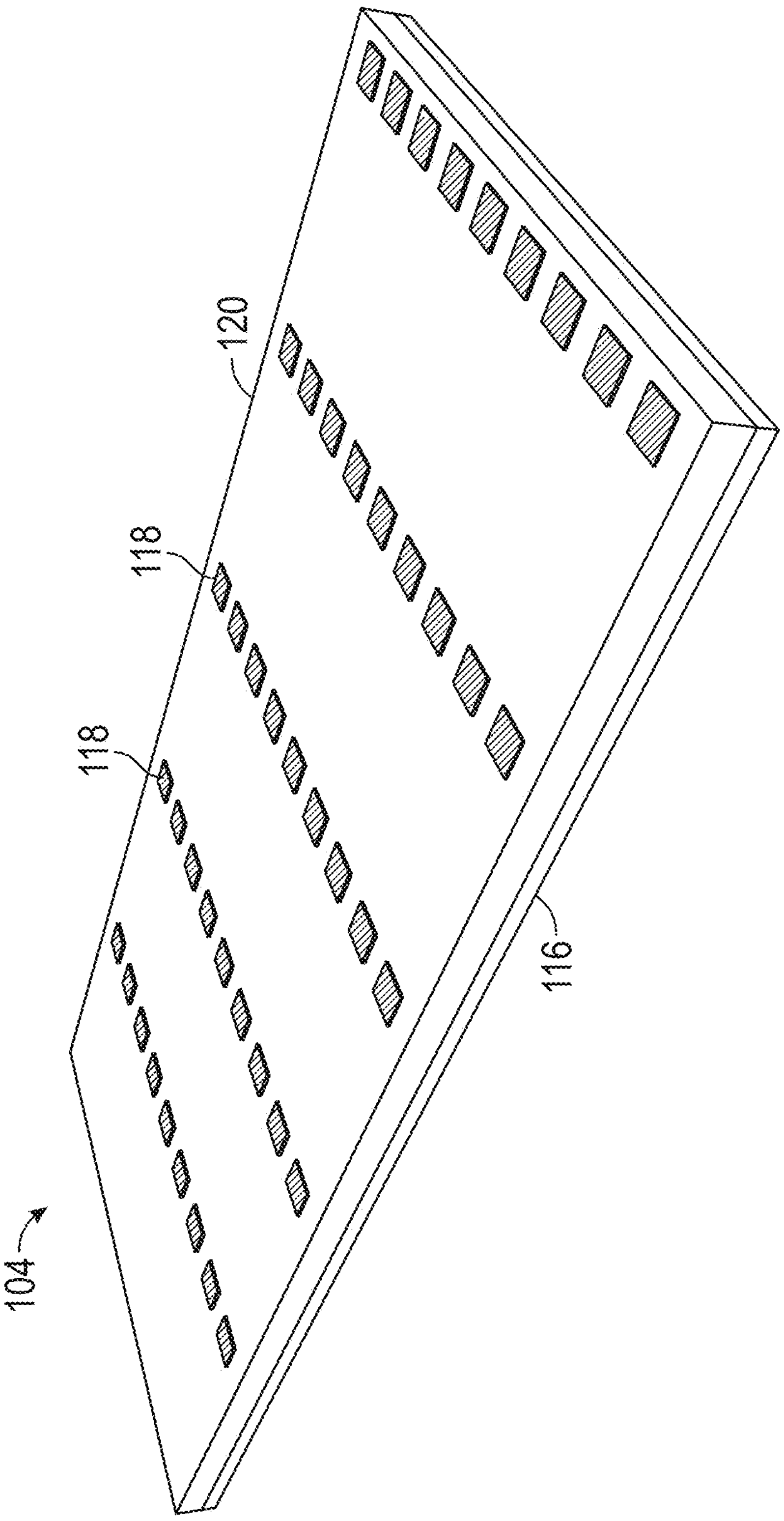
FIG. 7 is another schematic top perspective view of the second integrated device package component package of FIG. 6 that includes a molding compound, according to various implementations.
Figure 8:
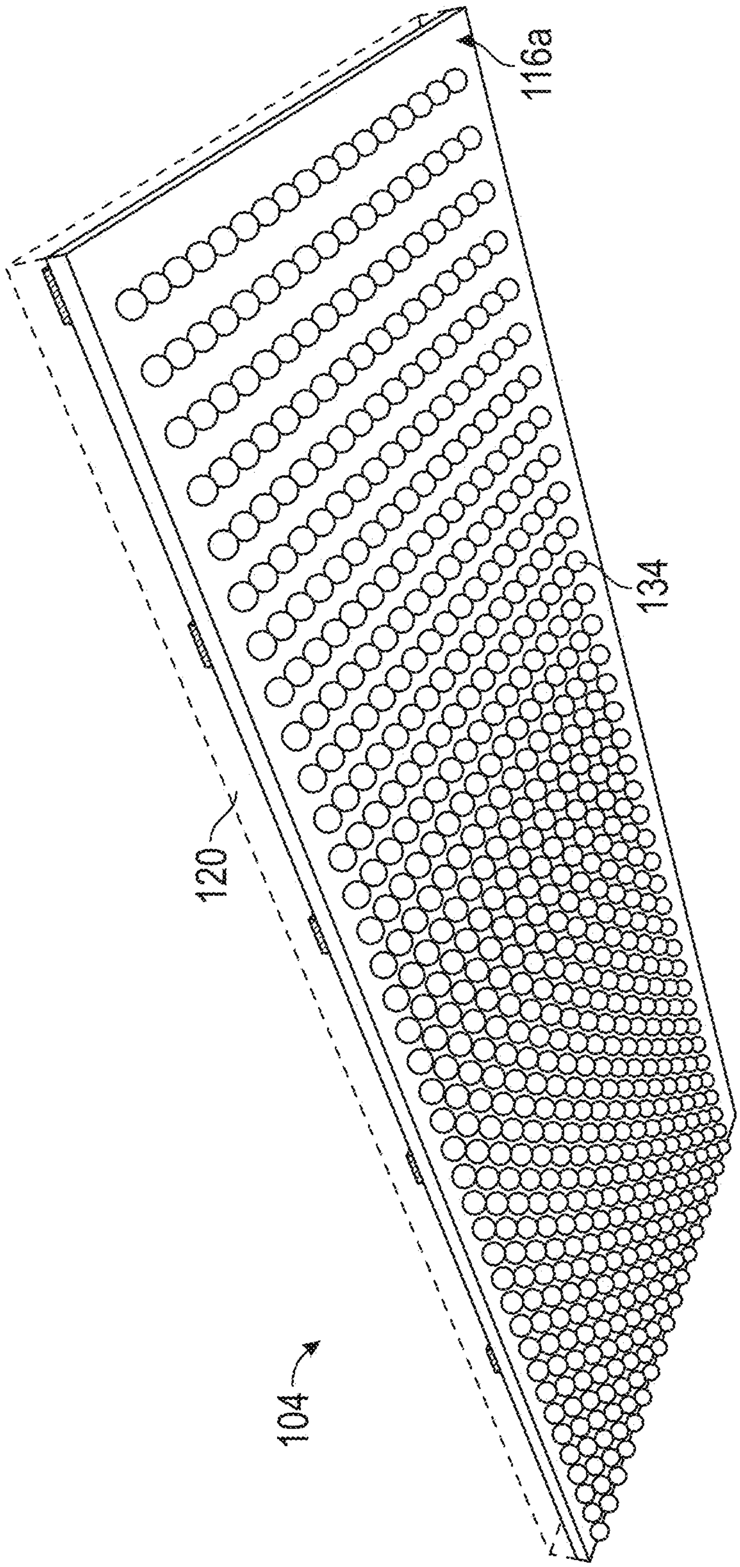
FIG. 8 is a schematic bottom perspective view of the second integrated device package component package shown in FIGS. 6 and 7, according to various implementations.

FIGS. 6-8 illustrate perspective views of the second integrated device package 104. FIG. 6 is a schematic top perspective view of the second integrated device package 104. FIG. 7 is a schematic top perspective view of the second integrated device package 104 that includes a second molding compound 120, according to various implementations. FIG. 8 is a schematic bottom perspective view of the second integrated device package 104 component package. The second integrated device package 104 can include a second substrate 116 having a first side 116*a* and a second side 116*b* opposite the first side 116*a*. The second substrate 116 can include additional vertical interconnects 118 mounted (e.g., with a conductive adhesive such as solder, conductive epoxy, etc.) to provide for an exposed connection for conductive attachment to the vertical interconnects 112 of the first integrated device package 102 in any suitable manner. For example, exposed surfaces 122 of opposing vertical interconnects 112, 118 can be mechanically and electrically connected, for example, by using solder, conductive epoxy, or any other electrical and thermal connection method used to couple two conductive surfaces together. The vertical interconnects 118 can have a first end 118*a* electrically connected to the first side 116*a* of the second substrate 116. The vertical interconnects 118 can have a second end 118*b* that is electrically connected to the vertical interconnects 112. The vertical interconnects 112 and vertical interconnects 118 can be disposed between the first substrate 106 and second substrate 116. A second molding compound 120 can at least partially embed the vertical interconnects 118. As shown, in various implementations, the exposed surfaces 122 of the vertical interconnects 112,118 can be flush with the outer surface of the molding compounds 110, 120. In other implementations, the vertical interconnects 112, 118 can extend past the outer surface of the molding compounds 110, 120. The second substrate 116 can also include an electrical terminal(s) 134 formed on a second side second side 116*b* of the second substrate second substrate 116. In some implementations, the electrical terminals can be a molded ball grid array (BGA) package, a land grid array, and/or a vertical interconnect PCB connections. Additionally, in some implementations, the electromagnets 114 can also be physically attached to the first side 116*a* of the second substrate 116 or the second molding compound 120 by an adhesive, such as an epoxy. In some implementations, additional electronic components 128 can be SMT mounted to a first side 116*a* of the second substrate 116. For example, the additional electronic components 128 can include capacitors.

Beneficially, the vertical interconnects 112 and/or 118 can provide a suitable conductive interface for high currents (e.g., greater than or equal to 5 A, greater than 20 A per connection, greater than 50 A per connection, for example 120 A) extending through the encapsulant or molding compounds 110, 120. For example, in some implementations, each interconnect 112 or 118 can be shaped and selected to enable a current passing therethrough in a range of 1 A to 120 A, in a range of 5 A to 120 A, in a range of 5 A to 100 A, or in a range of 5 A to 50 A. Moreover, the vertical interconnects 112 and/or 118 can be suitably selected to provide efficient thermal pathways from circuit components to an external device, such as a PCB, heat sink, etc. The vertical interconnects 112 and/or 118 can provide a through current pathway to a system motherboard (or to other component(s)). In various implementations, the vertical interconnects 112 and/or 118 can comprise a material that is conductive and attachable to the first substrate 106, second substrate 116, and/or other components. For example, the vertical interconnects 112 and/or 118 can comprise a metal, such as copper, gold, or other suitable metal. In some implementations, the interconnects 112 and/or 118 can comprise a non-reflowable material that is highly conductive to heat and electricity (e.g., copper, gold, silver, etc.). In some implementations, the interconnects 112 and/or 118 can include an electroplated plastic, a doped semiconductor (e.g., doped silicon). The interconnects 112 and/or 118 can be attached to the first substrate 106 and/or second substrate 116, to each other, or to other materials by way of a conductive adhesive (such as solder and/or a conductive epoxy (e.g., a silver-containing epoxy, a nickel-containing epoxy, copper-containing epoxy, carbon-containing epoxy, graphite-containing epoxy, etc.)). In various implementations, the interconnects 112, 118 can be sintered to the first substrate 106, second substrate 116, and/or to each other, for example using a silver and/or copper mixture. The thermal conductance of the interconnection can have a k-value of greater than or equal to 20.

The interconnects 112 and/or 118 can be picked and placed onto the respective substrates 104 using pick and place techniques and adhered using the bonding materials and methods described above. Beneficially, the use of pick-and-place techniques can enable the interconnects 112 and/or 118 to be placed at any desirable portion of the first substrate 106 and/or the second substrate 116. In some implementations, the interconnects 112 and/or 118 can be at least partially embedded in the molding compounds 110 and molding compounds 120, respectively. The vertical interconnects 112 and/or 118 can have exposed surfaces 122 that can be exposed through the molding compounds 110, 120 in any suitable manner for facilitating electrical connections. The exposed surfaces 122 can form a pad. In various implementations, a laser deflashing technique or release mold can be used to expose the surfaces 122 of the interconnects 112 and/or 118. In some implementations, the molding compound or encapsulant 110, 120 can have at least one layer removed (e.g., machined) to at least partially expose the interconnects 112 and/or 118.

The interconnects 112, 118 can be completely embedded in the molding compound 110, 120 of the respective packages 102, 104, except for the exposed connection surfaces 122. For example, lateral side surfaces 130 of the interconnects 112, 118 can be embedded in the molding compound 110, 120, respectively. Furthermore, the interconnects 112 and/or 118 can be laterally inset relative to an outermost side surface 132 of the electronic assembly 100 (e.g., such that no portion of the interconnects 112 and/or 118 are exposed on the outermost side surface 132 of the electronic assembly 100). For example, the outermost side surface 132 of the electronic assembly 100 may be at least partially defined by the exterior surface of the mold compounds 110, 120 and/or a side surface of the first substrate 106 and/or second substrate 116. By embedding the interconnects 112 and/or 118 within the molding compounds 110, 120, and insetting the interconnects 112 and/or 118 relative to the side surface 132 of the electronic assembly 100, the risk of shorting to external electrical components (such as components mounted to the system motherboard) can be reduced.

Moreover, the molding compounds 110, 120 of the respective packages 102, 104 can face one another and/or be disposed adjacent one another. In some arrangements, there may be a small gap between the respective molding compounds 110, 120 of the packages 102, 104 due to, for example, an intervening adhesive (e.g., a conductive adhesive such as solder) that connects the interconnects 112, 118 and which may space the respective molding compounds 110, 120 from one another. The electronic components 108, vertical interconnects 112, 118, and compounds 110, 120 can be disposed between the first substrate 106 and second substrate 116 of the integrated device packages 102, 104.

The vertical interconnects can be generally straight in some implementations. For example, the interconnects 112, 118 can have a first end **112*a*, 118*a* attached to the first substrate 106 and second substrate 116, respectively, and a second opposite end 112*b*, 118*b* exposed through the molding compounds 110, 120 that includes the exposed surface 122. In some implementations, at least one line perpendicular to the first substrate 106 and second substrate 116 can extend through both the first and second ends. Moreover, the interconnects 112, 118 can be oriented perpendicular to the first substrate 106 and second substrate 116. In some implementations, a horizontal cross-sectional of the interconnects 112, 118 perpendicular to the length L may not substantially vary along the length L. In various implementations, the vertical interconnects 112, 118 can comprise pillars that have a rounded (e.g., circular or elliptical) cross-section or a polygonal (e.g., rectangular) cross-section. The vertical interconnects 112, 118 can be wider or can have a larger cross-sectional area than lead frame substrates. The shape and size of the interconnects 112, 118 disclosed herein can beneficially enable high currents through the interconnects 112, 118**.

The vertical interconnects 112 and/or 118 can have an aspect ratio defined by the ratio of a height or length L of the interconnects 112 and/or 118 to a width W or diameter of the interconnects 112 and/or 118. The aspect ratio can be greater than 1:1, for example, in a range of 1:1 to 10:1, in a range of 1:1 to 5:1, in a range of 1:1 to 3:1, in a range of 2:1 to 7:1, or in a range of 2:1 to 5:1. In some implementations, the aspect ratio can be less than 1:1, for example, in a range of 0.2:1 to 1:1. In various implementations, the length L of the interconnects 112 and/or 118 can be in a range of 0.15 mm to 8 mm, in a range of 0.15 mm to 7 mm, in a range of 0.15 mm to 5 mm, or in a range of 0.5 mm to 5 mm. In various implementations, a cross-sectional area of the interconnects 112 and/or 118 taken perpendicular to a length L of the interconnects 112 and/or 118 can be at least 0.5 $mm^2$. For example, the cross-sectional area can be in a range of 0.5 $mm^2$ to 9 $mm^2$, in a range of 0.5 $mm^2$ to 5 $mm^2$, or in a range of 0.8 $mm^2$ to 5 $mm^2$. The length L of the interconnects 112, 118 can be in a range of 0.8 mm to 5 mm, in a range of 0.8 mm to 4 mm, in a range of 0.8 mm to 3 mm, in a range of 0.8 mm to 2 mm, in a range of 1 mm to 3 mm, or in a range of 1 mm to 2 mm. In various implementations, a width W of the interconnects 112, 118 can be in a range of 0.5 mm to 2 mm or in a range of 0.5 mm to 1.5 mm. The use of such relatively large interconnects 112, 118 can beneficially enable the use of high currents through the interconnects 112, 118.

FIGS. 9-14 illustrates various implementations of stacked hybrid assemblies 200. The stacked hybrid assembly 200 can be similar and/or identical to the electronic assembly 100. Unless otherwise noted, the components of FIGS. 9-14 can be the same as or generally similar to like-numbered components as mentioned above. A stacked hybrid assembly can include stacking multiple integrated circuits (ICs) and/or substrates of electronic components and devices to create a more compact and densely packed electronic system and/or high-performance system. Instead of spreading electronic components across a single plane, the components are stacked on top of each other, creating a three-dimensional (3D) structure. Each layer can contain various electronic components, such as integrated circuits (ICs), sensors, capacitors, and resistors. To establish electrical connections between different layers, interconnections like through-silicon vias (TSVs) or wire bonds are used. These connections facilitate data and power transfer between the stacked layers. Stacking components can allow for shorter interconnections, which can reduce signal propagation delays and improve the overall performance of the circuit.

Figure 9:
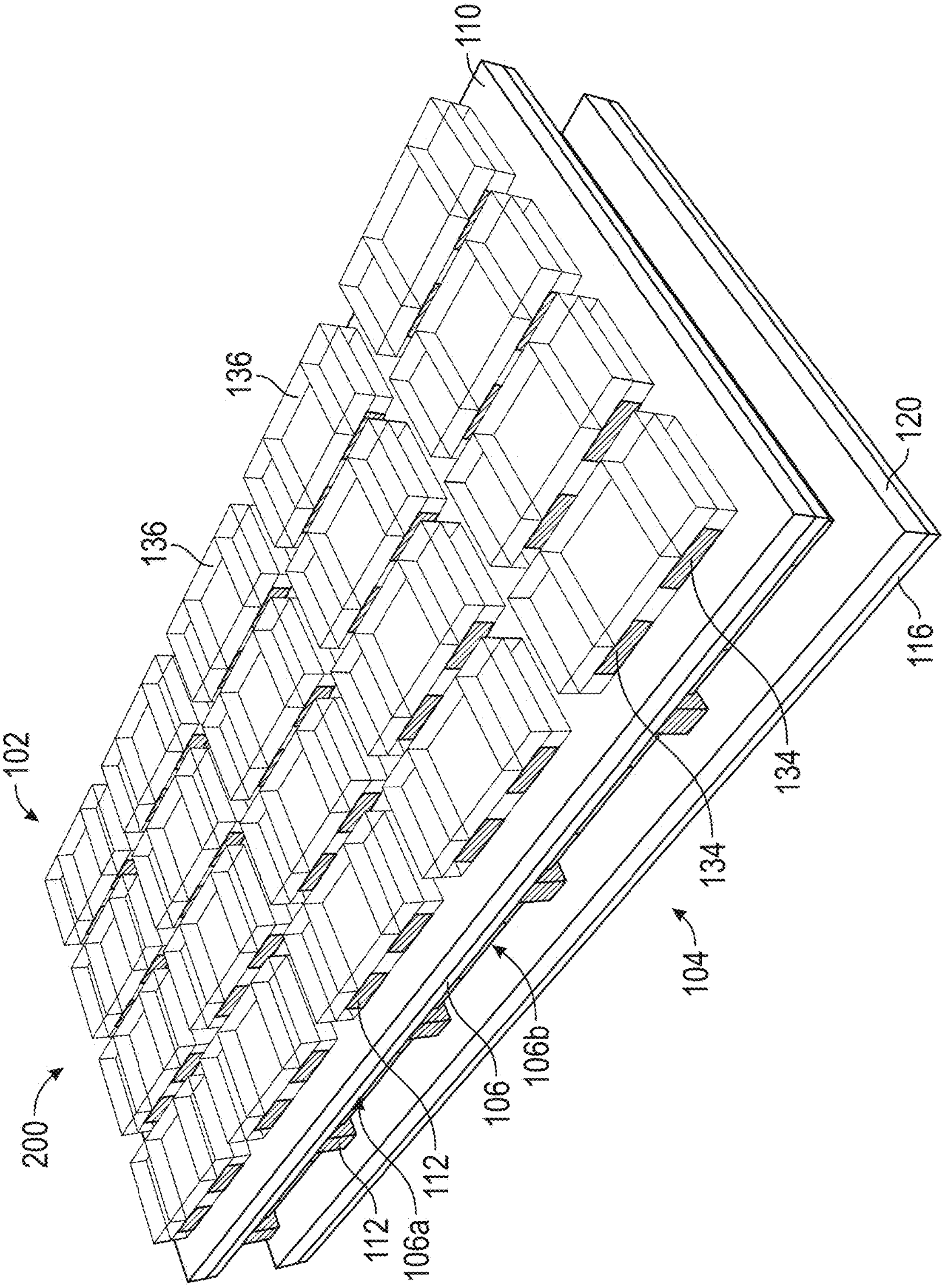
FIG. 9 is a schematic top perspective of a stacked hybrid assembly, according to various implementations.

FIG. 9 illustrates a stacked hybrid assembly 200 using through molded slotted vias (TMSVs) 134 to connect component on package (CoP) 136 packages on a first surface **106*a* and second surface 106*b* of a first substrate 106 (e.g., BT substrate). The TMSVs 134 can provide a passage for electrical signals and power between different layers and/or components in a three-dimensional (3D) electronic assembly. The TMSVs 134** can establish electrical connections between stacked layers and/or substrates by embedding solder material within a molded structure, creating a vertical interconnect. CoPs packages can include placing or more discrete components, such as passive components (e.g., resistors, capacitors) or even active components (e.g., discrete transistors), directly on the surface of an integrated circuit package or module. Using CoP packages can save space, improve electrical performance, and enhance the functionality of the integrated circuit. For example, by including a series of CoP packages on both the top and/or bottom of the upper substrate, power density can be increased. Further, bringing discrete components closer to the active integrated circuit (IC) can lead to more efficient heat dissipation, reducing the risk of overheating. Improved thermal management can allow electronic systems to operate at higher power levels and efficiency within a given volume.

Figure 10:
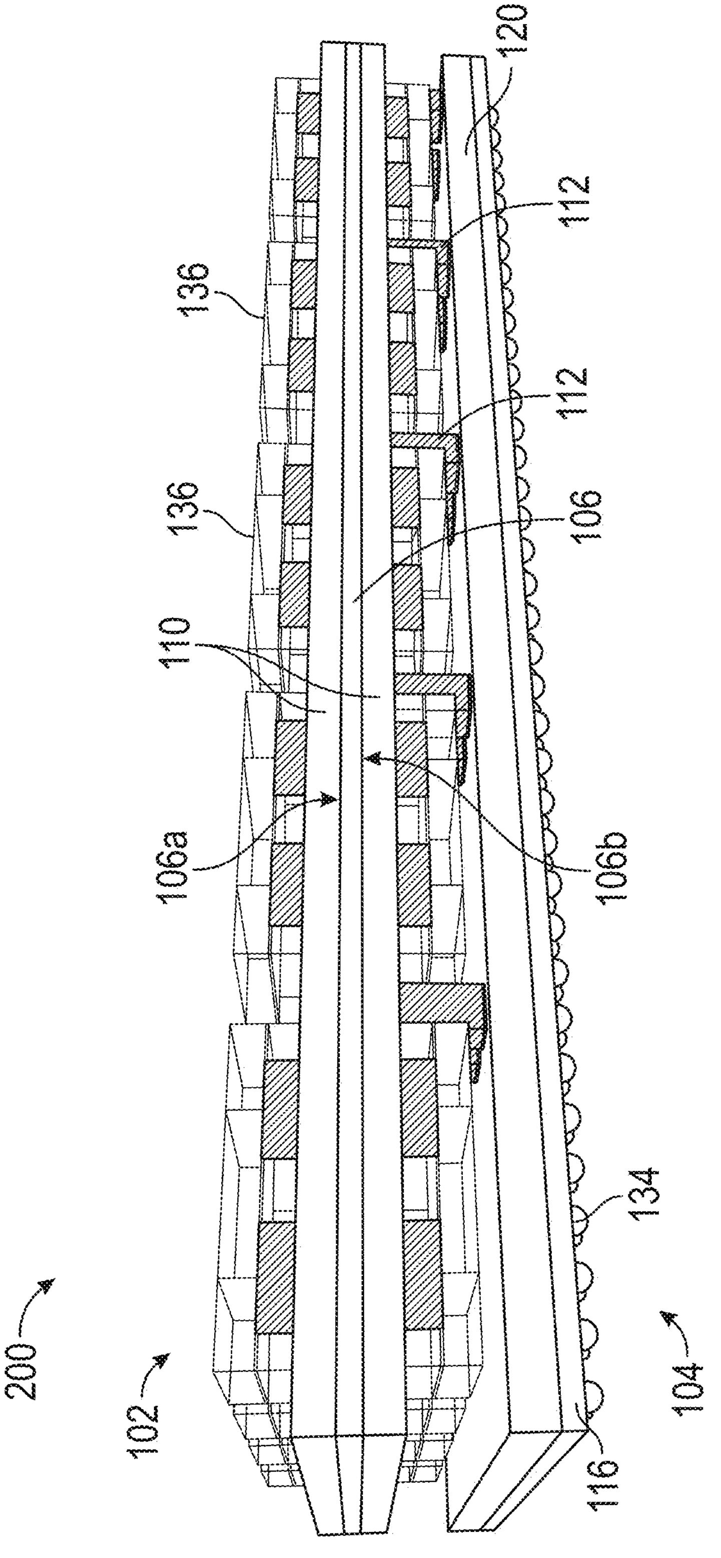
FIG. 10 is a schematic side perspective the stacked hybrid assembly shown in FIG. 9, according to various implementations.
Figure 11:
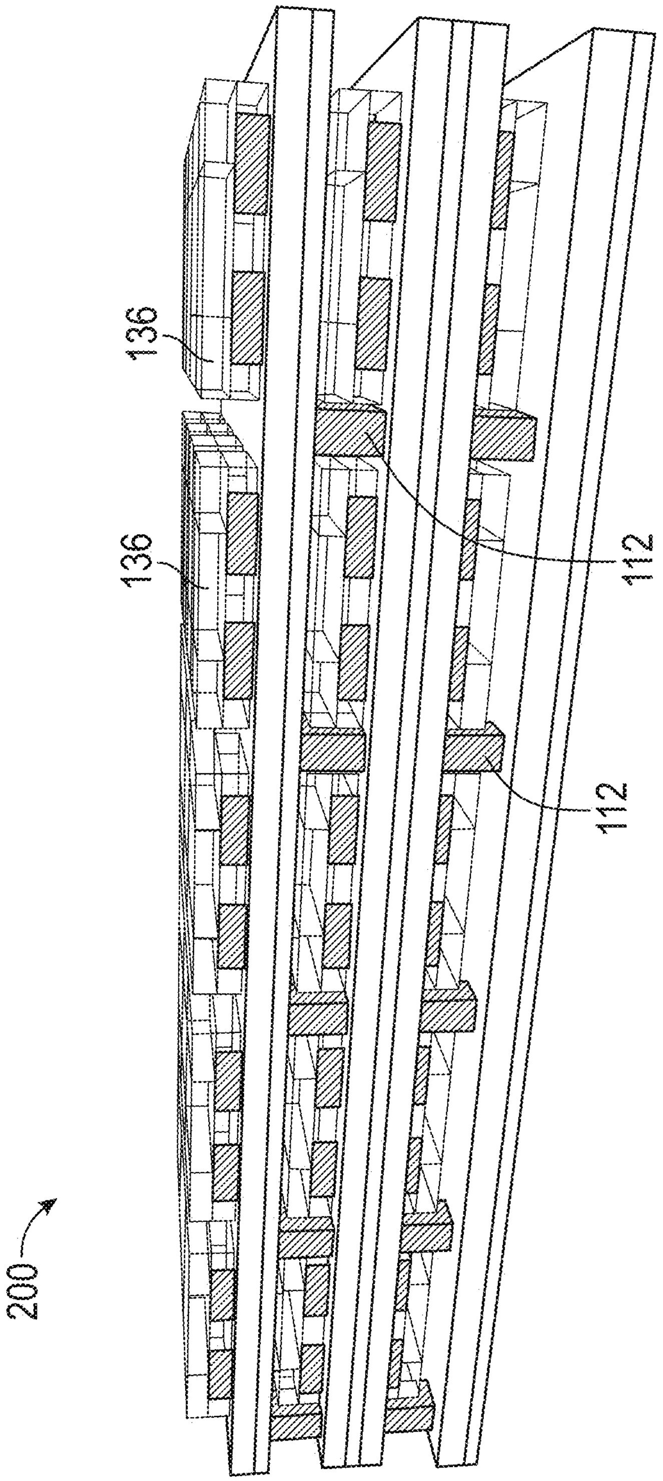
FIG. 11 is a schematic side perspective of the stacked hybrid assembly shown in FIGS. 9 and 10 having additional substrate layers, according to various implementations.

FIG. 10 illustrates another implementation of the stacked hybrid assembly 200 using CoP packages 136 on the first surface **106*a* and second surface 106*b* of the first substrate 106 (e.g., BT substrate). The electronic components 108 (e.g., active and/or passive devices) (not shown) can be overmolded by molding compounds 110, and the CoP packages 136 can be held in place with conductive adhesive (e.g., solder, a conductive epoxy, etc.) to the electronic components 108. FIG. 11 illustrates another exemplary implementation of the stacked hybrid assembly 200 having multiple layers of substrates using multiple configurations of CoP packages 136 and/or exposed electronic components 108 (e.g., FETs) (not shown). For example, the exemplary stacked hybrid assembly 200 can include three layers in the assembly stack as shown in FIG. 11**.

Figure 12:
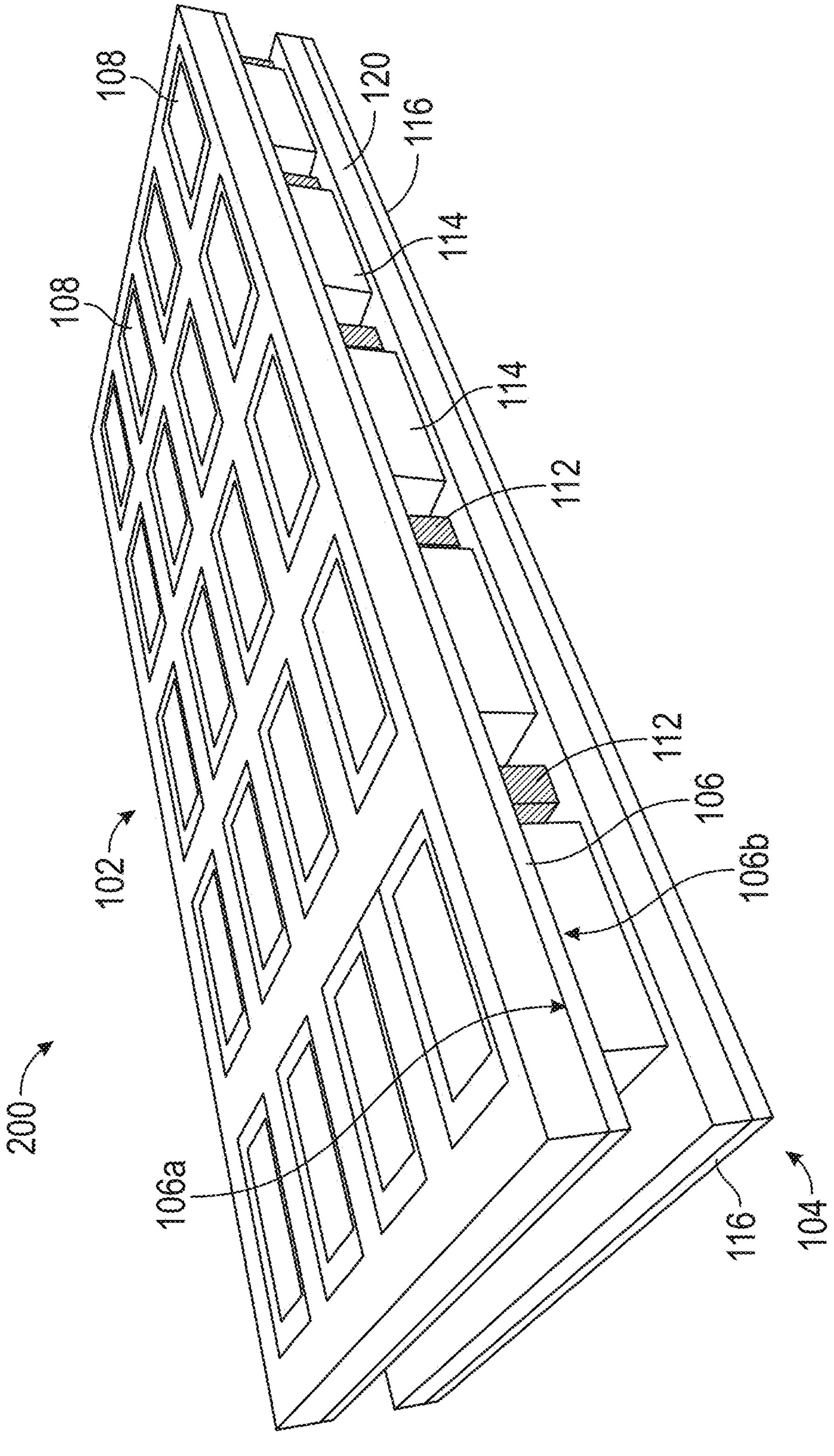
FIG. 12 is a schematic top perspective of a stacked hybrid assembly showing exposed electronic components, according to various implementations.
Figure 13:
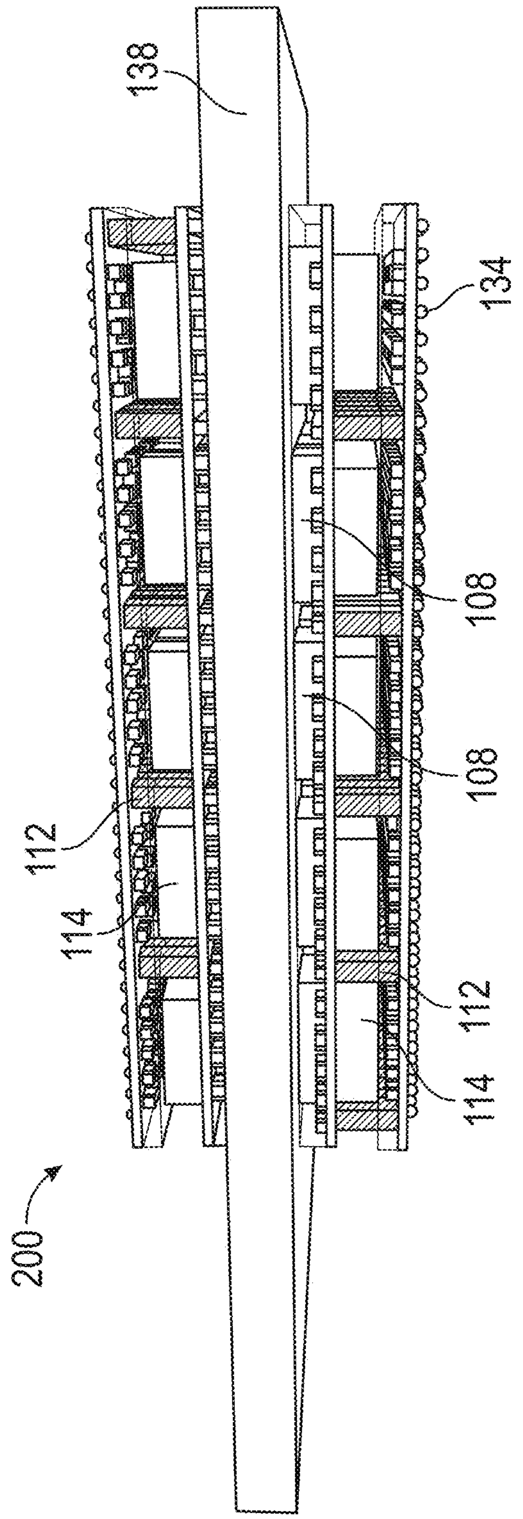
FIG. 13 is a schematic side perspective a stacked hybrid assembly having exposed electronic components in thermal attachment to a thermal sinking device, according to various implementations.
Figure 14:
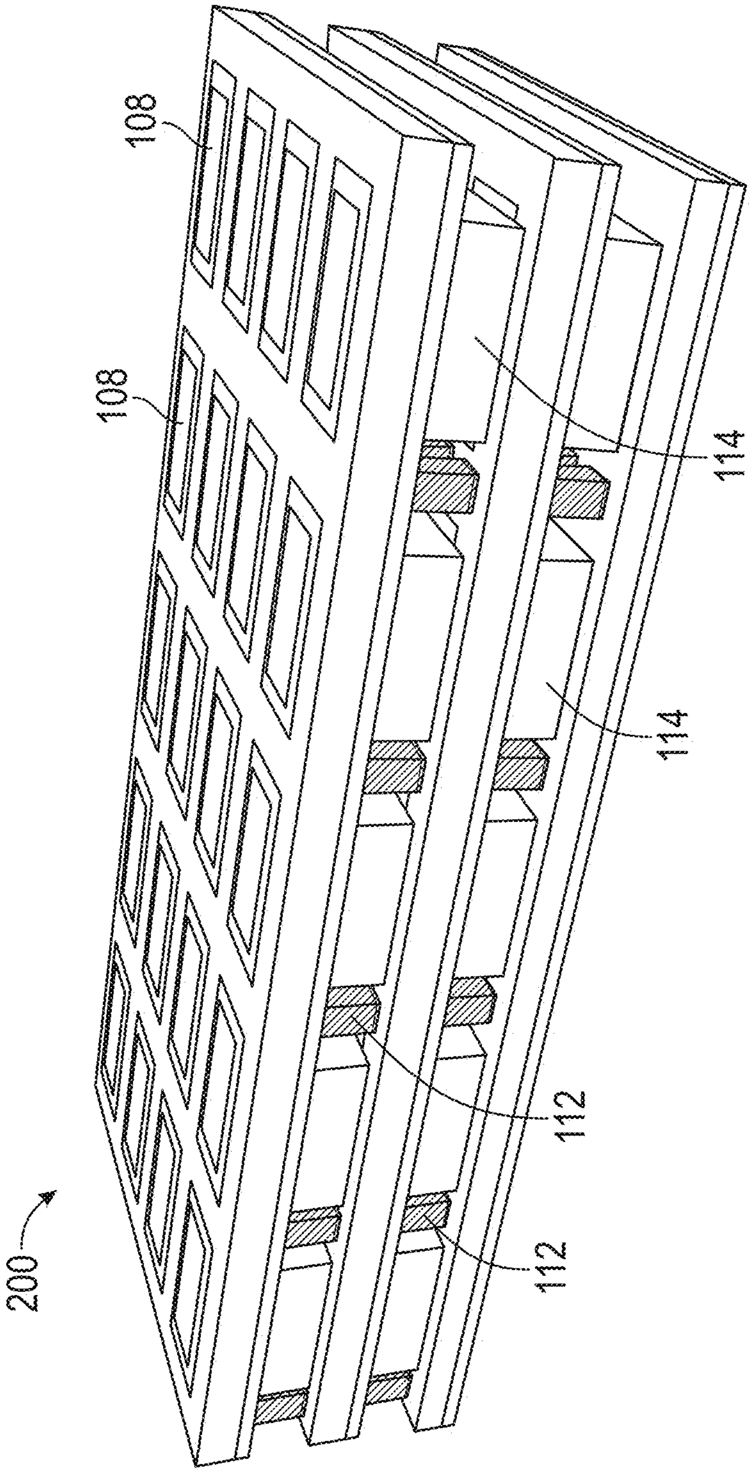
FIG. 14 is a schematic top perspective a stacked hybrid assembly having multiple layers of substrates with exposed electronic components, according to various implementations.

FIG. 12 illustrates another implementation of the stacked hybrid assembly 200 showing exposed electronic components 108 (e.g., DrMOS FETs) on the first surface 106*a* of the first substrate 106 and electromagnets 114 with vertical interconnects 112 on the second surface 106*b* of the first surface 106*a*. The electromagnets 114 and interconnects 112 can be soldered and/or thermally bonded to both the first substrate 106 and also to the second substrate 116 forming conductive pathways between the substrates 106, 116. The formation of the conductive pathways can also apply when multiple levels and/or layers of substrates are utilized. FIG. 13 illustrates another implementation of the stacked hybrid assembly 200 having exposed electronic components 108 (e.g., DrMOS FETs) in direct thermal attachment to a thermal sinking device 138 (e.g., cold plate, chill plate, heatsink, and/or heat pipe). The stacked hybrid assembly 200 can be attached to one or both sides of the thermal sinking device 138 for maximum thermal efficiency. FIG. 14 illustrates another implementation of the stacked hybrid assembly 200 having multiple layers of substrates with exposed electronic components 108 (e.g., DrMOS FETs). The stacked hybrid assembly 200 can be thermally bonded to each of the multiple layers. The stacked hybrid assembly 200 can overmolded for rework and upside down reflow applications.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

Several illustrative examples of stacked vertical power module and related systems and methods have been disclosed. Although this disclosure has been described in terms of certain illustrative examples and uses, other examples and other uses, including examples and uses which do not provide all of the features and advantages set forth herein, are also within the scope of this disclosure. Components, elements, features, acts, or steps may be arranged or performed differently than described and components, elements, features, acts, or steps may be combined, merged, added, or left out in various examples. All possible combinations and subcombinations of elements and components described herein are intended to be included in this disclosure. No single feature or group of features is necessary or indispensable.

Certain features that are described in this disclosure in the context of separate implementations may also be implemented in combination in a single implementation. Conversely, various features that are described in the context of a single implementation also may be implemented in multiple implementations separately or in any suitable subcombination. Moreover, although features may be described above as acting in certain combinations, one or more features from a claimed combination may in some cases be excised from the combination, and the combination may be claimed as a subcombination or variation of a subcombination.

Further, while illustrative examples have been described, any examples having equivalent elements, modifications, omissions, and/or combinations are also within the scope of this disclosure. Moreover, although certain aspects, advantages, and novel features are described herein, not necessarily all such advantages may be achieved in accordance with any particular example. For example, some examples within the scope of this disclosure achieve one advantage, or a group of advantages, as taught herein without necessarily achieving other advantages taught or suggested herein. Further, some examples may achieve different advantages than those taught or suggested herein.

Some examples have been described in connection with the accompanying drawings. The figures may or may not be drawn and/or shown to scale, but such scale should not be limiting, since dimensions and proportions other than what are shown are contemplated and are within the scope of the disclosed invention. Distances, angles, etc. are merely illustrative and do not necessarily bear an exact relationship to actual dimensions and layout of the devices illustrated. Components may be added, removed, and/or rearranged. Further, the disclosure herein of any particular feature, aspect, method, property, characteristic, quality, attribute, element, or the like in connection with various examples may be used in all other examples set forth herein. Additionally, any methods described herein may be practiced using any device suitable for performing the recited steps.

For purposes of summarizing the disclosure, certain aspects, advantages and features of the inventions have been described herein. Not all, or any such advantages are necessarily achieved in accordance with any particular example of the inventions disclosed herein. No aspects of this disclosure are essential or indispensable. In many examples, the devices, systems, and methods may be configured differently than illustrated in the figures. or description herein. For example, various functionalities provided by the illustrated modules may be combined, rearranged, added, or deleted. In some implementations, additional or different processors or modules may perform some or all of the functionalities described with reference to the examples described and illustrated in the figures. Many implementation variations are possible. Any of the features, structures, steps, or processes disclosed in this specification may be included in any example.

What is claimed is:

1. An electronic assembly comprising:

a first integrated device package comprising:

a first substrate;

a plurality of electronic components mounted to a first side of the first substrate;

a first plurality of vertical interconnects physically and electrically connected to a second side opposite the first side of the first substrate, the first plurality of vertical interconnects extending outwardly from the second side of the first substrate;

a first molding compound over at least portions of the plurality of electronic components; and an electromagnet physically and electrically connected to the second side of the first substrate, the electromagnet electrically connected to the plurality of electronic components via one or more electrical connections through the first substrate; and a second integrated device package comprising:

a second substrate;

a second plurality of vertical interconnects having a first end electrically connected to a first side of the second substrate, the second plurality of vertical interconnects having a second end electrically connected to the first plurality of vertical interconnects;

a second molding compound in which the second plurality of vertical interconnects is at least partially embedded; and electrical terminals formed on a second side of the second substrate, wherein the first and second vertical interconnects are disposed between the first and second substrates.

2. The electronic assembly of claim 1, wherein the one or more electrical connections are exposed through the first molding compound and the second molding compound to form a pad.

3. The electronic assembly of claim 1, wherein the first plurality of vertical interconnects have a height in a range of 1.5 mm to 4 mm.

4. The electronic assembly of claim 1, wherein the electrical terminals comprise a ball grid array.

5. The electronic assembly of claim 1, wherein the first plurality of vertical interconnects is electrically connected to the second plurality of vertical interconnects by a conductive adhesive.

6. The electronic assembly of claim 1, wherein the electromagnet is soldered to the second side of the first substrate.

7. The electronic assembly of claim 1, further comprising a third molding compound in which the first plurality of vertical interconnects and the electromagnet are at least partially embedded.

8. The electronic assembly of claim 1, wherein the first and second pluralities of vertical interconnects have an aspect ratio in a range of 1:1 to 10:1.

9. The electronic assembly of claim 1, wherein the electromagnet is physically attached to a top surface of the second integrated device package.

10. The electronic assembly of claim 9, wherein the electromagnet is physically attached by an adhesive.

11. The electronic assembly of claim 10, wherein the adhesive comprises epoxy.

12. The electronic assembly of claim 1, further comprising electrical components mounted to the second substrate.

13. The electronic assembly of claim 1, wherein the plurality of electronic components cycle on and off to control an electrical current passing through the electromagnet.

14. An electronic assembly comprising:

a first integrated device package comprising:

a first substrate;

a plurality of electronic components mounted to a first side of the first substrate;

a first plurality of vertical interconnects physically and electrically connected to a second side opposite the first side of the first substrate, the first plurality of vertical interconnects extending outwardly from the first substrate; and an electromagnet physically and electrically connected to the second side of the first substrate, wherein the electromagnet is electrically connected to the plurality of electronic components by one or more conductors through the first substrate.

15. The electronic assembly of claim 14, further comprising a molding compound over at least a portion of the plurality of electronic components.

16. The electronic assembly of claim 14, further comprising a second integrated device package mounted to the first integrated device package, the second integrated device package comprising a second substrate, a second plurality of vertical interconnects comprising a first end electrically connected to a first side of the second substrate, and electrical terminals formed on a second side of the second substrate, wherein a second end of the second plurality of vertical interconnects is electrically connected to the first plurality of vertical interconnects.

* * * * *